United States Patent
Ishigaki et al.

(10) Patent No.: US 6,271,569 B1
(45) Date of Patent: *Aug. 7, 2001

(54) SEMICONDUCTOR DEVICE HAVING MEMORY CELLS AND METHOD OF MANUFACTURING THE SAME

(75) Inventors: Yoshiyuki Ishigaki; Hiroki Honda, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/008,594

(22) Filed: Jan. 16, 1998

(30) Foreign Application Priority Data

Jul. 3, 1997 (JP) .................................................. 9-1784019

(51) Int. Cl.[7] .......................... H01L 29/76; H01L 27/108; H01L 27/11; H01L 27/02; B11C 11/40
(52) U.S. Cl. .......................... 257/381; 257/379; 257/306; 257/903; 257/904; 365/51; 365/154; 365/156
(58) Field of Search .............................. 365/51, 154, 156; 438/279, 280, 282, 291; 257/379, 380, 381, 538, 903, 904, 393, 66, 67, 69, 306, 368, 369, 370, 371, 372

(56) References Cited

U.S. PATENT DOCUMENTS

| | | | |
|---|---|---|---|
| 4,709,351 | * 11/1987 | Kajigaya | ................................ 257/390 |
| 4,805,147 | 2/1989 | Yamanaka et al. . | |
| 4,849,801 | 7/1989 | Honjyo et al. . | |
| 5,132,771 | 7/1992 | Yamanaka et al. . | |
| 5,296,729 | * 3/1994 | Yamanaka et al. | ................. 257/393 |
| 5,536,674 | 7/1996 | Kosa et al. . | |
| 5,610,856 | 3/1997 | Yoshizumi et al. . | |
| 5,687,111 | * 11/1997 | Wada et al. | ........................... 257/378 |
| 5,808,941 | * 9/1998 | Roberts | ................................ 257/536 |

FOREIGN PATENT DOCUMENTS

| | | |
|---|---|---|
| 58-148453 | 9/1983 | (JP) . |
| 61-283161 | 12/1986 | (JP) . |
| 2-12963 | 1/1990 | (JP) . |
| 3-157969 | 7/1991 | (JP) . |
| 6-151778 | 5/1994 | (JP) . |
| 7-74270 | 3/1995 | (JP) . |
| 7-130879 | 5/1995 | (JP) . |
| 8-195445 | 7/1996 | (JP) . |
| 8-236643 | 9/1996 | (JP) . |
| 8-250605 | 9/1996 | (JP) . |

OTHER PUBLICATIONS

A Symmetric Vss Cross–Under Bitcell Technology for 64Mb SRAMs—J.R. Pfiester, J.D. Hayden, M. Thomas, *F. Miller, J.–H. Lin, M.J. Blackwell, K. Mocala, Y.–C. Ku, C.K. Subramanian, **W. Waldo, S. Ajuria, B.M. James, and *BMartino—pp. 623–626.

"A Symmetric Vss Cross–Under Bitcell Technology for 64Mb SRAMs", J.R.Pfiester et al. IEDM 94 pp. 623–625.

* cited by examiner

Primary Examiner—William Mintel
Assistant Examiner—Ori Nadav
(74) Attorney, Agent, or Firm—McDermott, Will & Emery

(57) ABSTRACT

According to a semiconductor device and a method of manufacturing the same, a storage node has an increased capacity, and a resistance against soft error is improved. A GND interconnection is formed on a first interconnection layer including storage node portions with a dielectric film therebetween. Thereby, the storage node portions, the dielectric film, and the GND interconnection form a capacity element of the storage node portion. The first interconnection layer is arranged symmetrically around the center of the memory cell, and a plurality of memory cells having the same layout and neighboring to each other are arranged along the word lines.

16 Claims, 33 Drawing Sheets

SEMICONDUCTOR DEVICE HAVING MEMORY CELLS AND METHOD OF MANUFACTURING THE SAME

BACKGROUND OF THE INVENTION

1. Field of the Invention

The present invention relates to a semiconductor device and a method of manufacturing the same, and in particular to a semiconductor device having memory cells and a method of manufacturing the same.

2. Description of the Background Art

An SRAM (Static Random Access Memory) is a known kind of volatile semiconductor device. In the SRAM, memory cells are arranged at crossings between complementary type data lines (bit lines) and word lines which are arranged in a matrix form (i.e., in rows and columns). FIG. 59 is an equivalent circuit diagram showing a memory cell in a conventional SRAM. FIG. 60 shows a planar layout of the memory cell in the conventional SRAM. Referring to FIGS. 59 and 60, the memory cell in the conventional SRAM is formed of two access transistors A1 and A2, two driver transistors D1 and D2 and two high-resistance load elements R1 and R2.

Two high-resistance load elements R1 and R2 and two driver transistors D1 and D2 form a flip-flop circuit. This flip-flop circuit forms two cross-coupled storage nodes N1 and N2. Storage nodes Ni and N2 have bistability of High (N1) and Low (N2) or bistability of Low (N1) and High (N2). This bistable state is kept as long as the nodes are supplied with a predetermined power supply voltage.

One of source/drain regions of each of access transistors A1 and A2 is connected to storage node N1 or N2 which is an I/O terminal of the flip-flop circuit. The other source/drain region of each of access transistors A1 and A2 is connected to the bit line. Gate electrodes of access transistors A1 and A2 are connected to the word line. The word line control on/off of access transistors A1 and A2.

A drain region of each of driver transistors D1 and D2 is connected to one of source/drain regions of access transistor A1 or A2. Source regions of driver transistors D1 and D2 are connected to a GND line (VEE line). The gate is electrode of driver transistor D1 is connected to the source/drain region of access transistor A2. The gate electrode of driver transistor D2 is connected to the source/drain region of access transistor A1. High-resistance load elements R1 and R2 are connected to source/drain regions of access transistors A1 and A2, respectively. High-resistance load elements R1 and R2 are also connected at their other ends to a power supply line (Vcc line).

In an operation for writing data, word line (WL) is selected to turn on access transistors A1 and A2. In accordance with a desired logical value, a voltage is forcedly applied to the bit line pair, so that the flip-flop circuit is set to either of the foregoing bistable states.

For reading data, access transistors A1 and A2 are turned on. Potentials on storage nodes N1 and N2 are transmitted onto the bit lines.

Nowadays, there is a tendency to reduce an areas occupied by memory cells in the SRAM for reducing the cost, as is also desired in other devices. With reduction in occupied area of the memory cells, however, deterioration of a resistance against soft error becomes more manifest. The "soft error" represents the following phenomenon. Electrons and hole pairs are generated by incident alpha-rays passed through a package material and others, and the electrons are attracted toward the storage nodes of memory cells. Therefore, storage information of the memory cell is inverted to cause a random error. This error is called the soft error. As the area occupied by the memory cell decreases, a storage capacity C of the storage node portion in the memory cell decreases. Therefore, the quantity of charges (Q=CxV) which can be accumulated in the storage node part also decreases. Reduction in charges accumulated in the storage node portion results in a problem that the soft error is more liable to occur.

FIG. 61 shows a planar layout of polycrystalline silicon and active regions at a first level or layer in the conventional memory cells shown in FIG. 60. FIG. 62 is a planar layout of polycrystalline silicon at a second level. Referring to FIGS. 61 and 62, there are shown two memory cells which are symmetrical with respect to a line and are arranged along word lines 105a and 105d. According to the layout of polycrystalline silicon layers 111a–111f at the second level, two high-resistance portions 111a of a neighboring memory cells each have one end connected to a common Vcc interconnection 111f. Therefore, a region surrounded by two high-resistance portions 111a and Vcc interconnection 111f is closed at its one end and has a dead-lane form. As is well known, the pattern in the dead-lane form causes such a problem that a portion of a photoresist near the closed end cannot be accurately patterned without difficulty.

More specifically, a pattern having a rapidly changed portion such as a pattern closed at one end causes reduction in resolution of an optical focusing system, because the optical focusing system cannot accurately transfer such a rapid change. When patterning is performed to produce a form having a rapidly changed portion such as a closed portion, therefore, patterned high-resistance portion 111a has an excessively large width at a portion requiring a rapidly changed pattern as shown in FIG. 62. More specifically, as shown in FIG. 62, high-resistance portion 111a disadvantageously has an excessively large width WHE near a closed end (base end), so that a resistance value of high-resistance portion 111a decreases.

For overcoming the above problem, high-resistance portion 111a must have a large length LHR. If high-resistance portion 111a has larger length LHR, storage node portion 111c in the memory cell of the same size has a smaller length $L_{NODE}$. As a result, storage node portion 111c has a smaller planar area, and therefore has a smaller capacity. The small capacity of the storage node portion 111c causes a problem that the soft error is liable to arise as already described.

In the conventional layout shown in FIG. 62, a distance D1 is required between storage node portions 111c of the neighboring memory cells, and for this purpose, a distance of half the minimum processable size or more must be kept with respect to the boundary between the neighboring memory cells. This restricts an allowable maximum value of width $W_{NODE}$ of storage node portion 111c. This also prevents easy increasing of the capacity of storage node portion 111c.

According to the planar layout of the memory cells in the conventional SRAM shown in FIGS. 60 to 62, it is difficult to provide a large area of storage node portion 111a as already described, and consequently it is difficult to increase the capacity of storage node portion 111c. Therefore, it is difficult to improve a resistance against soft error if the size of memory cell is reduced.

If two neighboring memory cells are arranged symmetrically with respect to a line as shown in FIG. 61, an appropriate distance D3 must be kept between gate electrodes 105c of two driver transistors of the neighboring memory cells. As a result, it is difficult to reduce a space between the neighboring memory cells.

In the conventional planar layout shown in FIGS. 60 and 61, a GND region 108d and a word line 105d are overlapped with each other in a plan view. Due to this, a large parasitic capacity is present between word line 105d and GND region 108d, so that a large RC delay occurs on word line 105d.

SUMMARY OF THE INVENTION

An object of the invention is to provide a semiconductor device which can improve a resistance against soft error even if memory cells have a reduced size.

Another object of the invention is to provide a semiconductor device which can remarkably increase a storage capacity of a storage node portion.

Still another object of the invention is to provide a semiconductor device which can improve a resistance against soft error and can reduce an RC delay on a word line.

Yet another object of the invention is to provide a method of manufacturing a semiconductor device, and particularly a method allowing easy manufacturing of a semiconductor device which can suppress a soft error even when memory cells have a reduced size.

According to an aspect of the invention, a semiconductor device including memory cells is provided with a first interconnection layer and a GND interconnection layer. The first interconnection layer is formed on a semiconductor substrate, and includes a high-resistance interconnection portion and a storage node portion. The GND interconnection layer is formed on the first interconnection layer with a dielectric film therebetween. The storage node portion of the first interconnection layer, the GND interconnection layer and the dielectric film form a capacity element of the storage node portion. The first interconnection layer is arranged symmetrically around a center of the memory cell. The plurality of memory cells have the same layout and neighbor to each other in a direction of a word line. According to the semiconductor device of the above aspect, the storage node portion of the first interconnection layer, the GND interconnection layer and the dielectric film interposed therebetween form the capacity element of the storage node portion. Therefore, the storage node portion can have a remarkably increased capacity, even if the memory cell has a reduced size. Accordingly, a resistance against soft error can be remarkably increased, even if the memory cell has the reduced size. Since the first interconnection layer including the high-resistance interconnection portion and the storage node portion is arranged symmetrically around the center of the memory cell, a good balance can be kept between left and right inverters forming the memory cell. Consequently, data can be stably stored and held. Since the plurality of memory cells having the same layout neighbor to each other in the direction of the word line, a pattern does not have a dead-lane or closed end form, and has a continuously open form. This prevents a difficulty in patterning of a photoresist in contrast to the case of patterning a photoresist having a dead-lane form. Therefore, the patterning can be performed accurately. Accordingly, such a disadvantage can be prevented that a high-resistance portion has an excessively wide portion and therefore has a low resistance value in contrast to the case of a pattern having a dead-lane form. In the case where a dead-lane form is present in the pattern, the high-resistance portion must have a large length for preventing lowering of the resistance value of the high-resistance portion. According to the invention, however, it is not necessary to increase a length of the high-resistance portion, so that it is not necessary to reduce a length of the storage node portion connected to the high-resistance portion. Therefore, the present invention can effectively prevent lowering of the capacity of the storage node portion.

The semiconductor device of the above aspect may further include first and second impurity regions forming a GND region. In this case, the first and second impurity regions are connected to the GND interconnection layer. The first and second impurity regions are formed independently of each other in each memory cell. The first and second impurity regions in each memory cell are formed independently of the GND region in the neighboring memory cell. Owing to this structure in which the first and second impurity regions forming the GND region are formed independently of the GND region in the neighboring memory cell, it is possible to prevent flow of a column current in the neighboring memory cell (i.e., a current flowing through the neighboring memory cell) into the first and second impurity regions. Thereby, it is possible to suppress rising of the potential on the GND region, so that the potential on the GND region can be stabilized.

The semiconductor device of the above aspect may further include first and second impurity regions connected to the GND interconnection layer and forming a GND region. In this structure, the first and second impurity regions do not overlap with the word line in a planar layout. According to this structure, a parasitic capacity between the word line and the first and second impurity regions can be smaller than that in the structure including the word line overlapping with the first and second impurity regions in a planar layout. Thereby, an RC delay on the word line can be reduced.

The semiconductor device of the above aspect may further include a second interconnection layer including a ate electrode, formed on the semiconductor substrate and located under the first interconnection layer. In this structure, the first interconnection layer includes a power supply interconnection portion in addition to the high-resistance interconnection portion and the storage node portion. In this structure, the semiconductor device may further include a first interlayer insulating film formed on the second interconnection layer and the semiconductor substrate, located under the first interconnection layer, and having a first contact hole connecting the second interconnection layer and the semiconductor substrate to the first interconnection layer. The first contact hole preferably has a diameter larger than double the sum of the thickness of the first interconnection layer and the thickness of the dielectric film, and smaller than double the sum of the thickness of the first interconnection layer, the thickness of the dielectric film and the thickness of the GND interconnection layer. By employing the first contact hole having the diameter which is larger than double the sum of the thicknesses of the first interconnection layer and the dielectric film, the storage node portion and the dielectric film are formed along the inner side surface of the first contact hole, so that the capacity element of the storage node is formed along the inner side surface of the first contact hole. Consequently, the storage node portion can have a remarkably increased capacity. By employing the first contact hole having the diameter which is smaller than double the sum of the thicknesses of the first interconnection layer, the dielectric film and the GND interconnection layer, the GND interconnection layer can be formed to fill completely the first contact hole with the GND interconnection layer. Thereby, the upper surface of the GND interconnection layer can have an improved flatness.

This facilitates patterning of an upper layer which will be formed in a later step.

In the semiconductor device of the above aspect, the first interlayer insulating film may include a second contact hole connecting the GND interconnection layer to the first and second impurity regions. In this structure, the second contact hole has a diameter smaller than double the thickness of the GND interconnection layer. Thereby, the GND interconnection layer can be formed in the second contact hole to fill completely the second contact hole with the GND interconnection layer. Thereby, the upper surface of the GND interconnection layer can be further flattened. This facilitates patterning of an upper layer which will be formed later.

In the semiconductor device of the above aspect, a portion of the dielectric film forming the capacity element of the storage node portion may have a thickness smaller than that of the other portion. According to this structure, the capacity of the storage node portion can be increased by employing the thin dielectric film, and the dielectric film at the other portion can have an improved function as an etching stopper film owing to the increased thickness. Thus, the thick portion of the dielectric film can effectively function as the etching stopper when patterning the GND interconnection layer formed on the dielectric film. Thereby, such a disadvantage can be effectively avoided that the dielectric film is shaved and the first interconnection layer is broken due to overetching in the process of patterning the GND interconnection layer.

In the structure of the semiconductor device of the above aspect, the dielectric film may have an extended portion located at least on the upper, side and lower surfaces of the storage node portion of the first interconnection layer. Owing to this structure, not only the upper and side surfaces of the storage node portion but also the lower surface thereof can be used as the capacity. This can increase a capacity of the storage node portion.

According to the semiconductor device of the above aspect, the GND interconnection layer may have a two-layer structure.

The semiconductor device of the above aspect may further include a second interconnection layer including a gate electrode, formed on the semiconductor substrate and located under the first interconnection layer. In this structure, the first interconnection layer includes a lower layer in contact with the semiconductor substrate and the second interconnection layer, and an upper layer formed on the lower layer. The GND interconnection layer covers side end surfaces of the lower and upper layers with the dielectric film therebetween. According to this structure, the first interconnection layer including the storage node portion is formed of the two-layer structure including the lower and upper layers, and the side end surfaces of the lower and upper layers are covered with the GND interconnection layer with the dielectric film therebetween. Thereby, the side end surfaces of the lower and upper layers of the first interconnection layer can be used as the capacity of the storage node portion. Since the surface area of the storage node portion is increased by an extent corresponding to the lengths of the side end surfaces of the lower and upper layers, the storage node can have a further increased capacity. This improves the resistance against soft error. In this case, the lower layer may include a power supply interconnection portion. Also, the upper layer may include the power supply interconnection portion. The upper layer may include the high-resistance portion, and the lower layer may be thicker than the upper layer. According to this structure, the thin upper layer can increase the resistance value of the high-resistance interconnection portion, and the capacity of the storage node can be increased owing to the side end surfaces of the thick lower layer and the thin upper layer. The structure may further include a bit line leader electrode formed of the same layer as the lower layer. According to this structure, the lower layer of the first interconnection layer and the bit line leader electrode can be simultaneously formed by patterning the single layer, so that the manufacturing process can be simple.

The semiconductor device may further include a first interlayer insulating film formed on the second interconnection layer and the semiconductor substrate, located under the first interconnection layer, and having a first contact hole connecting the second interconnection layer and the semiconductor substrate to the first interconnection layer. In this structure, the first contact hole has a diameter larger than double the sum of the thickness of the lower layer, the thickness of the upper layer and the thickness of the dielectric film, and smaller than double the sum of the thickness of the lower layer, the thickness of the upper layer, the thickness of the GND interconnection layer and the thickness of the dielectric film layer. By employing the first contact hole having the diameter which is larger than double the sum of the thicknesses of the upper and lower layers and the thickness of the dielectric film, the first interconnection layer formed of the lower and upper layers and the dielectric film are formed along the inner side surface of the first contact hole. Thereby, the storage node included-in the first interconnection layer can have a remarkably increased capacity. By employing the first contact hole having the diameter which is smaller than double the sum of the thicknesses of the lower and upper layers, the thickness of the GND interconnection layer and the thickness of the dielectric film, the GND interconnection layer can be formed to fill completely the first contact hole with the GND interconnection layer. Thereby, the GND interconnection layer can have a flat upper surface. This facilitates patterning of an interconnection layer which will be formed on the GND interconnection layer in a later step.

According to another aspect of the invention, a method of manufacturing a semiconductor device including memory cells includes the following steps. A first interconnection layer, which includes a high-resistance portion and a storage node portion, and is symmetrical around a center of the memory cell, is formed on a semiconductor substrate. A GND interconnection layer is formed on the first interconnection layer with a dielectric film therebetween. The plurality of memory cells having the same layout and neighboring to each other in a direction of a word line are formed. In this manufacturing method, the GND interconnection layer is formed on the first interconnection layer including the storage node portion with the dielectric film therebetween, as described above. Thereby, the storage node portion, the GND interconnection layer and the dielectric film form a capacity element of the storage node portion. Therefore, the capacity of the storage node portion can be remarkably increased. Since the first interconnection layer is arranged symmetrically around the center of the memory cell, a good balance can be kept between left and right inverters forming the memory cell. Consequently, storing and holding characteristics can be stable. Since the memory cells having the same layout neighbor to each other in the direction of the word line, a pattern formed thereby has a continuously open form. This facilitates patterning of a photoresist compared with the case of patterning a photoresist having a dead-lane form. Accordingly, such a disadvantage can be prevented that an excessively wide portion is formed at a high-resistance portion by the patterning.

In the above manufacturing method, the step of forming the first interconnection layer and the GND interconnection layer may include the following steps. First, an interlayer insulating film is formed on the semiconductor substrate. The first interconnection layer and the dielectric film are successively formed on the interlayer insulating film, and a first GND interconnection layer is formed on the dielectric film. The first GND interconnection layer, the dielectric film and the interlayer insulating film are patterned to form a contact hole reaching the surface of the semiconductor substrate. A second GND interconnection layer filling the contact hole and covering the upper surface of the first GND interconnection layer is formed. By forming the first GND interconnection layer before forming the contact hole as described above, the first GND film can protect the dielectric film during etching which is performed for removing a natural oxide film at the surface of the substrate after forming the contact hole. Thereby, it is possible to prevent reduction in film thickness of the dielectric film, which may be caused by the etching, and therefore the capacity of the storage node can be stable.

According to the manufacturing method of the above aspect, the following steps may be performed prior to formation of the first interconnection layer. First and second impurity regions forming a GND region are formed independently of each other at the main surface of the semiconductor substrate. The first and second impurity regions in each memory cell are independent of the first and second impurity regions in the neighboring memory cell. Owing to this structure in which the first and second impurity regions in each memory cell are formed independently of the first and second impurity regions in the neighboring memory cell, a current does not flow into the first and second impurity regions in the memory cell from the neighboring memory cell, so that rising of the GND potential can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

(Embodiment 1)

Figure 1:
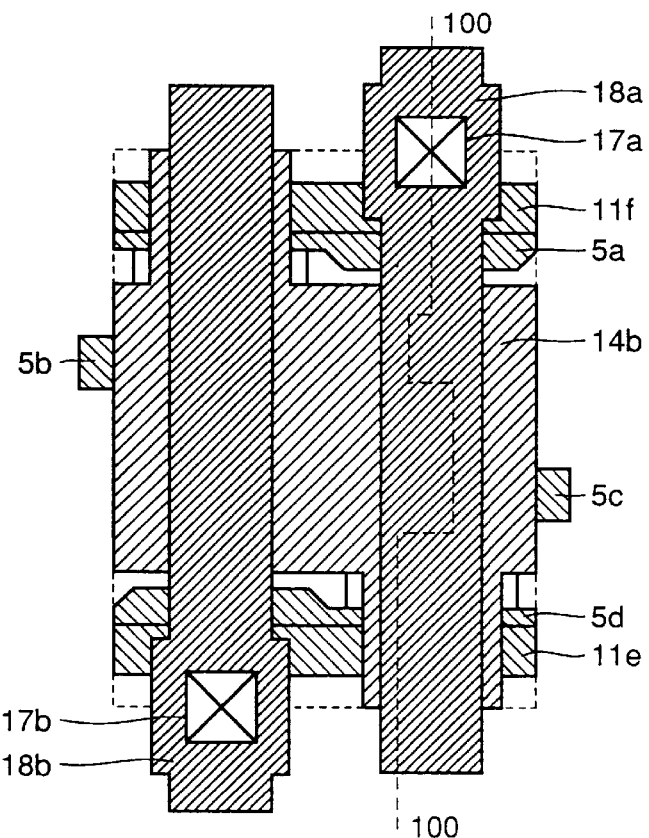
FIG. 1 shows a planar layout of a memory cell in an SRAM according to an embodiment 1 of the invention.
Figure 2:
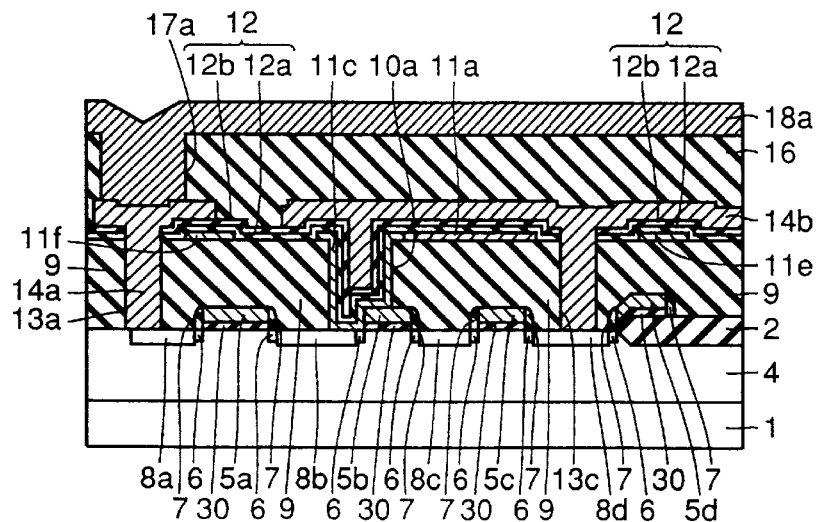
FIG. 2 is a cross section of the memory cell taken along line 100—100 in FIG. 1.

Referring to FIGS. 1 and 2, a sectional structure of a memory cell in an SRAM of an embodiment 1 will be described below.

A memory cell in the embodiment 1 is provided with a $P^-$-type well region 4 at a surface of an $N^-$-type silicon substrate 1. A field insulating film 2 for element isolation is formed at a predetermined region of a surface of $P^-$-type well region. $N^+$-type source/drain regions 8a, 8b, 8c and 8d which are spaced from each other by a predetermined distance are formed at an active region surrounded by field insulating film 2. $N^-$-type source/drain regions 6 are formed near the sides of $N^+$-type source/drain regions 8a–8d, which neighbor to the corresponding channels, respectively. N-type source/drain regions 6 and $N^+$-type source/drain regions 8a–8d form source/drain regions of an LDD (Lightly Doped Drain) structure.

A word line 5a is formed on the channel region located between source/drain regions 8a and 8b with a gate insulating film 30 therebetween. A gate electrode Sb of a driver transistor is formed on the channel region located between $N^+$-type source/drain regions 8b and 8c with gate insulating film 30 therebetween. A gate electrode 5c of a driver transistor is formed on the channel region located between $N^+$-type source/drain regions 8c and 8d with gate insulating film 30 therebetween. A word line 5d is formed on field insulating film 2 with gate insulating film 30 therebetween. Side wall oxide films 7 are formed on side surfaces of word lines 5a and 5d as well as side surfaces of gate electrodes 5b and 5c. The whole surface is covered with an interlayer insulating film 9 made of an $SiO_2$ film. Contact holes 13a, 10a and 10c are formed at predetermined regions of interlayer insulating film 9, respectively.

In contact hole 13a, there is formed a bit line contact pad 14a which is in contact with $N^+$-type source/drain region 8a and fills contact hole 13a. Along the inner side surface of contact hole 10a, there is formed a storage node portion 11c which is in contact with $N^+$-type source/drain region 8b and gate electrode 5b. A high-resistance portion 11a is formed continuously to storage node portion 11c. Vcc interconnection portions 11e and 11f which continue to high-resistance portion 11a and storage node portion 11c are formed on the upper surface of interlayer insulating film 9. Storage node portion 11c, high-resistance portion 11a and Vcc interconnection portions 11e and 11f are made of a single polycrystalline silicon film having a thickness from about 200 to about 1000 Å.

A dielectric film 12 is formed over the upper surfaces of storage node portion 11c, high-resistance portion 11a and interlayer insulating film 9. Dielectric film 12 is formed of two layers, i.e., a silicon nitride film ($Si_3N_4$) 12a and a silicon oxide film ($SiO_2$ or SiON) 12b. There is formed a GND interconnection 14b which fills contact hole 10a and has a portion located in contact hole 13c for electrical contact with $N^+$-type source/drain region 8d. Bit line contact pad 14a and GND interconnection 14b are formed by patterning a single polycrystalline silicon film having a film thickness from about 1000 to about 2000 Å.

An interlayer insulating film 16 is formed over bit line contact pad 14a, GND interconnection 14b and dielectric film 12. A bit line contact hole 17a is formed at a region of interlayer insulating film 16 located above bit line contact pad 14a. A bit line 18a extends along the upper surface of interlayer insulating film 16. Bit line 18a has a portion which is located in bit line contact hole 17a and is in electrical contact with bit line contact pad 14a. Bit line 18a is formed of a first metal interconnection which is made of aluminum or the like. Although FIG. 2 shows only bit line 18a, parallel spaced two bit lines 18a and 18b are actually provided for one memory cell as shown in FIG. 1.

As described above, the memory cell in the SRAM of the embodiment 1 is provided with storage node portion 11c formed along the inner side surface of contact hole 10a, and is also provided with dielectric film 12 covering the surface of storage node portion 11c. Further, GND interconnection 14b covers the surface of dielectric film 12 located in contact hole 10a. Thereby, storage node portion 11c, dielectric film 12 and GND interconnection 14b form the capacitor located along the inner side surface of contact hole 10a. As a result, the capacity of the storage node portion 11c can be remarkably increased. Accordingly, the resistance against soft error can be remarkably increased even if the memory cell size is reduced.

Figure 3:
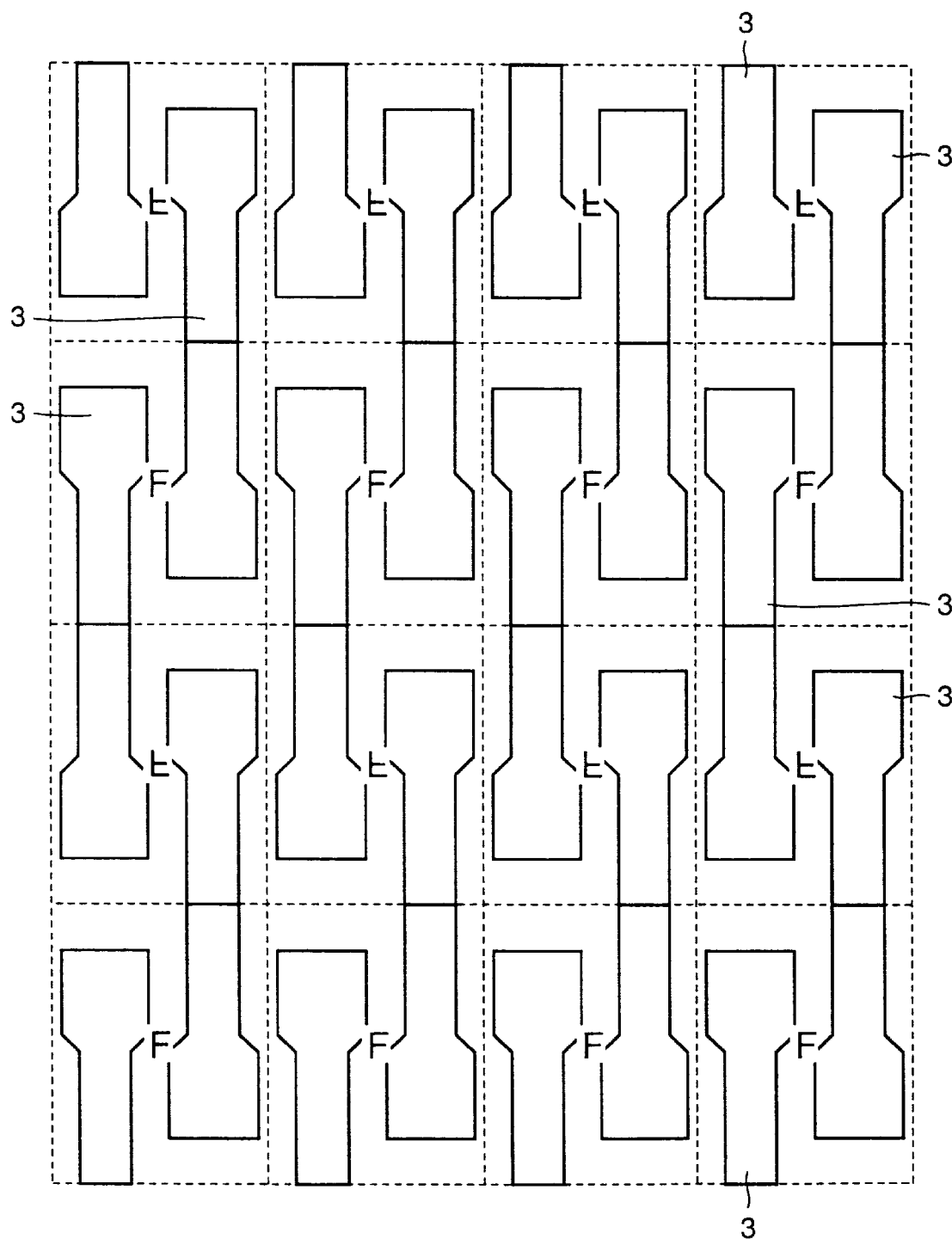
FIG. 3 shows a planar layout of 16 memory cells each having the same structure as that of the embodiment 1 shown in FIGS. 1 and 2.
Figure 4:
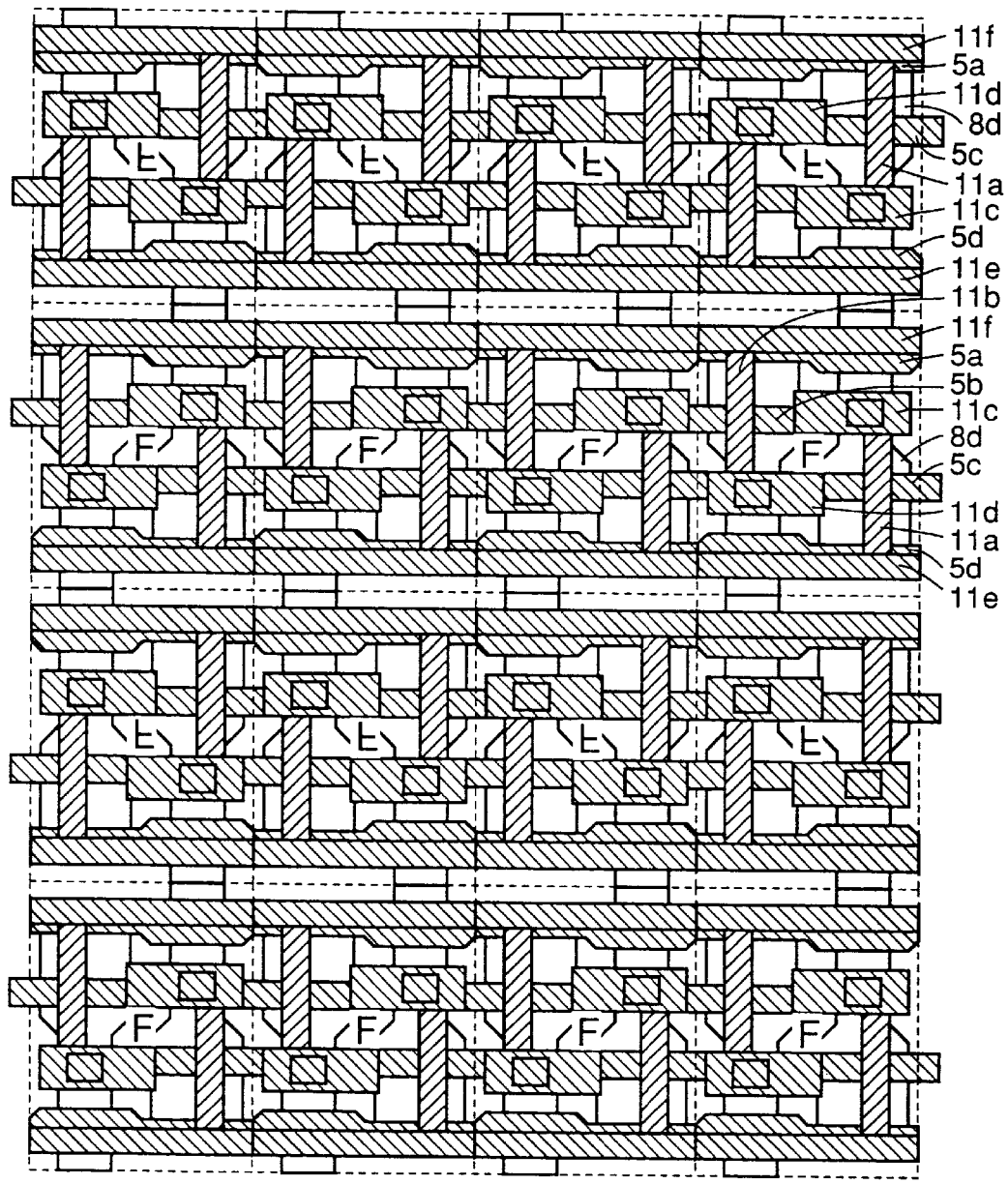
FIG. 4 shows a planar layout of 16 memory cells each having the same structure as that of the embodiment 1 shown in FIGS. 1 and 2.
Figure 5:
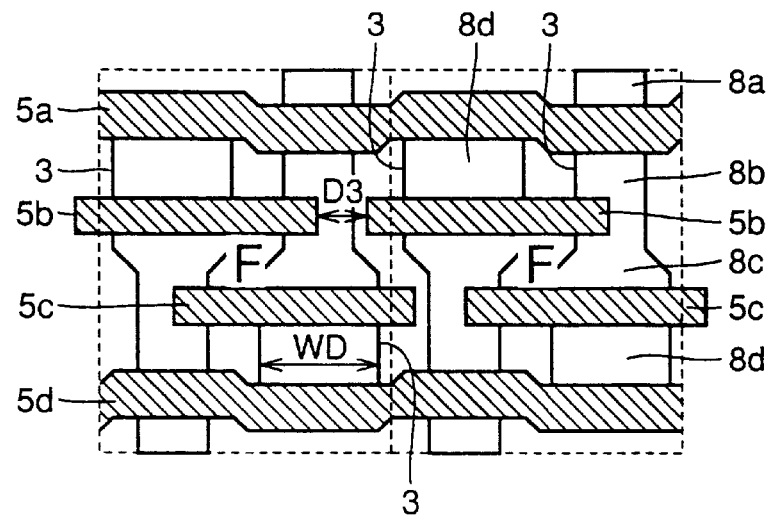
FIG. 5 shows a planar layout, and specifically shows a polycrystalline silicon film and an active region at a first level in a structure including two memory cells having the same layout and each having the same structure as that shown in FIGS. 1 and 2.
Figure 6:
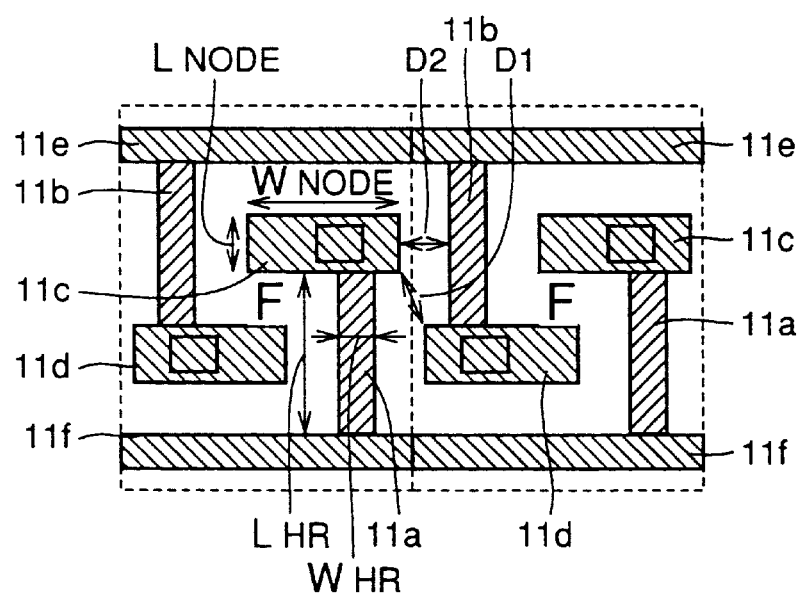
FIG. 6 shows a planar layout, and specifically shows a polycrystalline silicon film at a second level in the structure including two memory cells having the same layout and each having the same structure as that shown in FIGS. 1 and 2.
Figure 61:
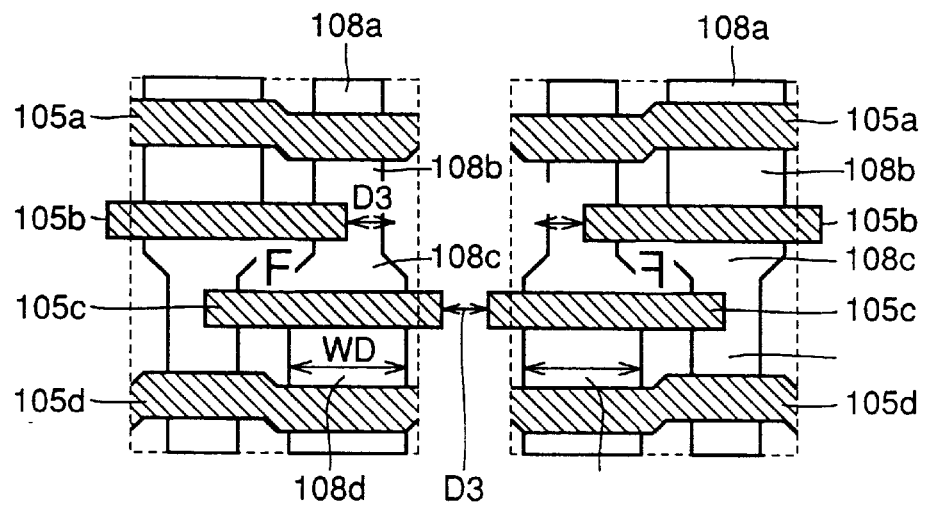
FIG. 61 shows a planar layout of a structure in which conventional memory cells shown in FIG. 60 are arranged symmetrically with respect to a line.

According to the structure of the embodiment 1, as shown in FIGS. 3 and 4, the plurality of memory cells which have the same layout and neighbor to each other are arranged along word lines 5a and 5d. This can achieve an effect which will now be described below with reference to FIGS. 5 and 6. FIG. 5 shows an arrangement of the word lines and gate electrodes which are formed of the polycrystalline silicon layer at the first level. FIG. 6 shows an arrangement of the storage node portions, high-resistance portions and power supply interconnection portion which are formed of the polycrystalline silicon at the second level. According to the invention, as shown in FIGS. 5 and 6, the memory cells having the same layout and neighbor to each other are arranged along word lines 5a and 5d. Thereby, the pattern of the polycrystalline silicon at the second level does not have a closed end at the high-resistance portion but has a continuously open form in contrast to the prior art shown in FIGS. 61 and 62. This facilitates patterning of a photoresist in contrast to the prior art shown in FIG. 62.

More specifically, according to the arrangement of the memory cells of the embodiment 1 shown in FIG. 6, the pattern does not have a dead-lane form but has a continuously open form, so that disadvantageous lowering of resolution can be prevented. Consequently, good patterning can be performed. Accordingly, high-resistance portion 11a as well as other portions can be formed accurately in accordance with the design without disadvantageous lowering of the resistance value of the high-resistance portion already described in connection with FIG. 62. Consequently, it is possible to provide storage node portion 11c of a larger area. Accordingly, lowering of the capacity of the storage node portion can be effectively prevented.

In the aforementioned embodiment, as shown in FIG. 6, storage node portions 11c and 11d as well as high-resistance portions 11a and 11b are arranged symmetrically around the center of the memory cell, so that a good balance is kept between left and right inverters forming the memory cell. This can stabilize the storing and holding characteristics. In this embodiment, as shown in FIG. 6, the memory cells of the same layout neighbor to each other in the lateral direction, so that a distance D2 between storage node portion 11c and high-resistance portion 11b of the neighboring memory cell can be equal to the minimum processable size. In contrast to the prior art shown in FIG. 62, therefore, it is not necessary to keep a space between storage node portions 111c of the neighboring memory cells by restricting the length $W_{NODE}$ of storage node portion 111c. Thus, storage node portion 11c shown in FIG. 6 can have larger lateral width $W_{NODE}$ than that in the prior art shown in FIG. 62 owing to the arrangement shown in FIG. 6. Thereby, it is possible to increase an area of the storage node portion 11c, and thereby can increase the capacity of the storage node.

Owing to the planar configuration of the active region 3 in the embodiment 1 shown in FIG. 5, the driver transistor can have the active region of a large width WD. This increases a current flow rate of the driver transistor, so that a conductance ratio (current ratio) between the driver transistor and the access transistor, which is also called a "cell ratio", can be increased. Thereby, a gain of the inverter can be large, and a transition portion of the inverter output can have a rapid gradient, so that the memory cell can operate stably.

Figure 62:
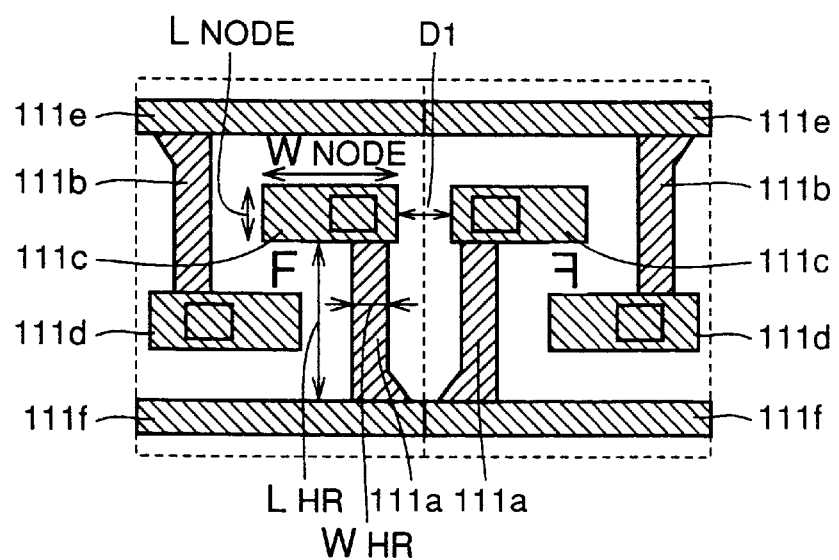
FIG. 62 shows a planar layout showing a polycrystalline silicon film at a second level in the structure including the conventional memory cells arranged symmetrically with respect to a line.

According to the layout shown in FIG. 6, storage node portion 11c in the memory cell is shifted from the storage node portion 11d in the neighboring memory cell in contrast to the structure shown in FIG. 62. Therefore, the portion of the storage node portion 11c in the memory cell and the portion of the storage node portion 11d in the neighboring memory cell, which are spaced from each other by the minimum distance, are opposed together through a reduced area. Accordingly, it is possible to reduce a probability of short-circuit between the storage node portion 11c in the memory cell and the storage node portion 11d in the neighboring memory cell, for example, due to fine foreign particles having an electrical conductivity or a patterning failure caused by a development failure of a photoresist, and therefore can prevent these failures.

In this embodiment, GND interconnection 14b shown in FIG. 1 makes a connection between the longitudinally neighboring memory cells as well as a connection between the laterally neighboring memory cells. Thereby, the GND potential of the memory cells can be further stabilized, so that the cell operation can be stabilized.

In this embodiment, $N^+$-type source/drain region 8d forming the GND region is formed independently in one memory cell, as shown in FIG. 5, and the GND region in the neighboring memory cell is also formed independently. Thereby, the GND region is not commonly used by the memory cells neighboring to each other, so that the column current of the neighboring memory cell (i.e., a current flowing through the neighboring memory cell) does not flow into $N^+$-type source/drain region 8d forming the GND region. Thereby, rising of the GND potential can be suppressed efficiently, so that the GND potential can be stabilized.

In this embodiment, as shown in FIG. 2, contact hole 10a has the diameter which is larger than double the sum of thickness of storage node portion 11c and the thickness of dielectric film 12, and is smaller than double the sum of the thickness of storage node portion 11c, the thickness of dielectric film 12 and the thickness of GND interconnection layer 14b. Owing to this structure in which the diameter of contact hole 1a is larger than double the sum of thicknesses of storage node portion 11c and dielectric film 12, storage node portion 11c and dielectric film 12 are formed along the inner side surface of contact hole 10a. Consequently, the capacitor formed of storage node portion 11c, dielectric film 12 and GND interconnection 14b can be formed along the inner side surface of contact hole 10a, so that the capacity of storage node portion 11c can be increased remarkably. Further, the diameter of contact hole 10a is smaller than double the sum of the thicknesses of storage node portion 11c, dielectric film 12 and GND interconnection layer 14b, so that GND interconnection 14b can be formed to fill contact hole 10a with GND interconnection 14b. Thereby, the upper surface of GND interconnection 14b can be flattened, which facilitates patterning for forming the upper layer of GND interconnection 14b.

The diameter of contact hole 13c shown in FIG. 2 is desirably smaller than double the thickness of GND interconnection 14b. This allows formation of GND interconnection 14b completely filling contact hole 13c. Consequently, the upper layer can be patterned easily.

In this embodiment, as shown in FIGS. 2 and 5, word line 5d does not overlap with N$^+$-type source/drain region 8d forming the GND region in a planar layout. Thus, field insulating film 2 is not formed under word line 5d. Therefore, the parasitic capacity of word line 5d can be reduced as compared with the case where N$^+$-type source/drain region 8d is formed under word line 5d with gate insulating film 30 therebetween. Consequently, an RC delay on word line 5d can be reduced.

It is desired that interlayer insulating film 9 made of the SiO$_2$ film shown in FIG. 2 has as large a film thickness as possible. Increase in film thickness of interlayer insulating film 9 results in increase in length of storage node portion 11c formed along the side surface of contact hole 10a, and correspondingly the capacity of storage node portion 11c can be increased.

Figure 7:
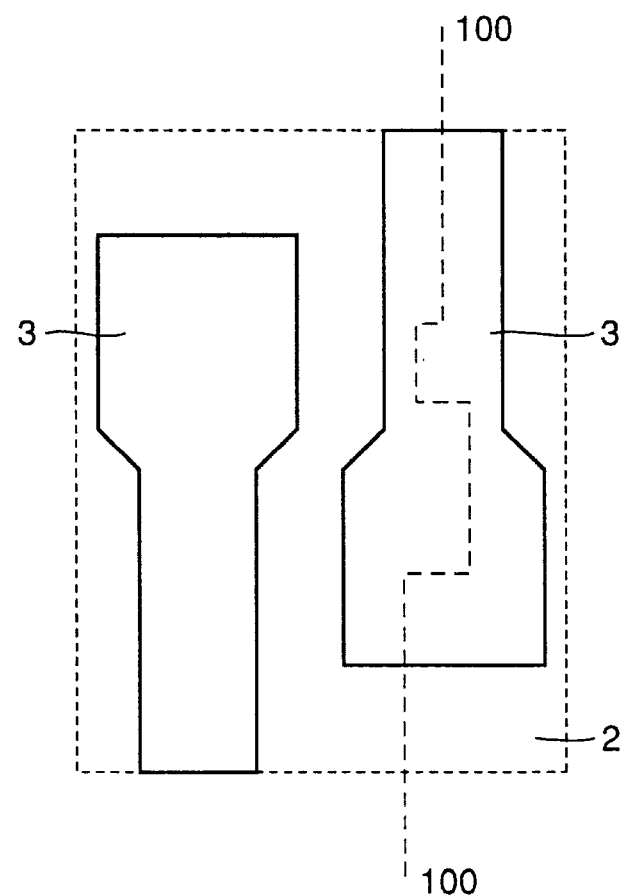
FIG. 7 shows a planar layout, and particularly shows a process of manufacturing the memory cell in the SRAM of the embodiment 1 of the invention.
Figure 8:
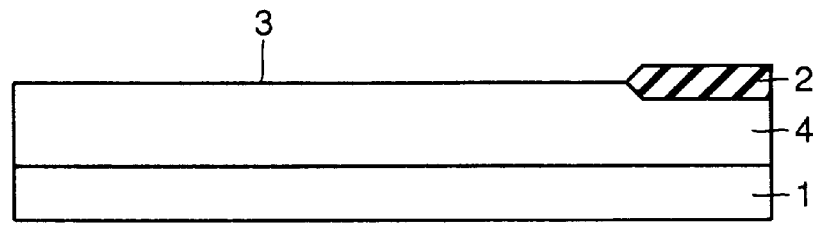
FIG. 8 is a cross section of the memory cell taken along line 100—100 in FIG. 7.

Referring to FIGS. 7 to 16, description will now be given on a process of manufacturing the memory cells in the SRAM of the embodiment 1. FIGS. 8, 10, 12, 14 and 16 are cross sections taken along line 100—100 in FIGS. 7, 9, 11, 13 and 15, respectively. As shown in FIGS. 7 and 8, field insulating film 2 which is made of an SiO$_2$ film and has a film thickness from about 2000 to about 5000 Å is formed on N$^-$-type silicon substrate 1, for example, by an LOCOS (Local Oxidation of Silicon) method. Field insulating film 2 is formed by selective thermal oxidation using the SiO$_2$ film (not shown) as a pad film and the Si$_3$N$_4$ film (not shown) deposited thereon as a anti-oxidation mask.

Thereafter, the pad film and the SI$_3$N$_4$ film are removed to expose the active region 3 at the surface of N$^-$-type silicon substrate 1. Thereafter, P-type impurity such as boron is implanted into the main surface of N$^-$-type silicon substrate 1 under the conditions of about 200–700 KeV and about 1×10$^{12}$–1×10$^{13}$ cm$^{-2}$. Further, P-type impurity such as boron is implanted under the conditions of about 30–70 KeV and about 3×10$^{12}$ cm$^{-2}$. Thereby, threshold voltages of the access transistor and driver transistor are set. In this manner, P$^-$-type well region 4 having an impurity concentration of about 10$^{16}$–10$^{18}$/cm$^3$ is formed at the main surface of N$^-$-type silicon substrate 1.

Figure 9:
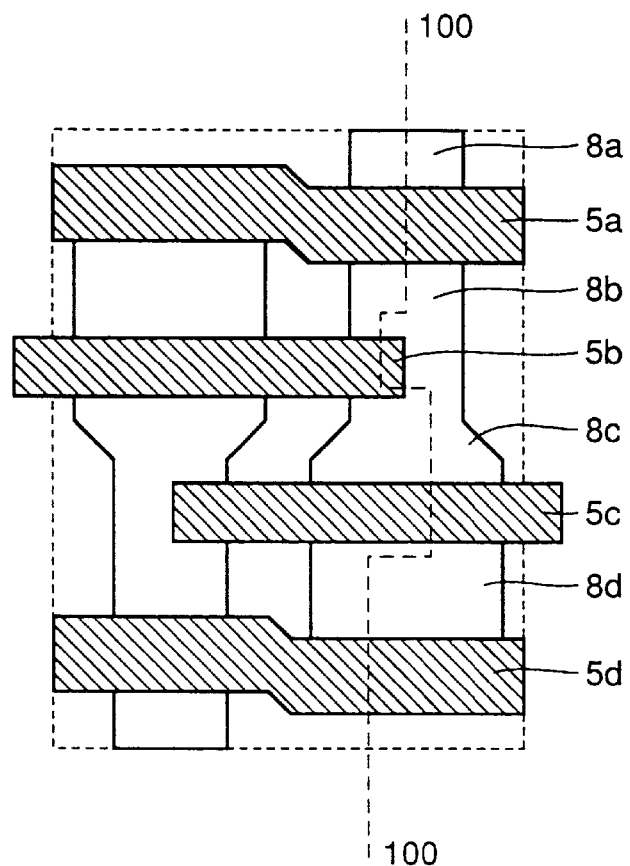
FIG. 9 shows a planar layout, and particularly shows a process of manufacturing the memory cell in the SRAM of the embodiment 1 of the invention.
Figure 10:
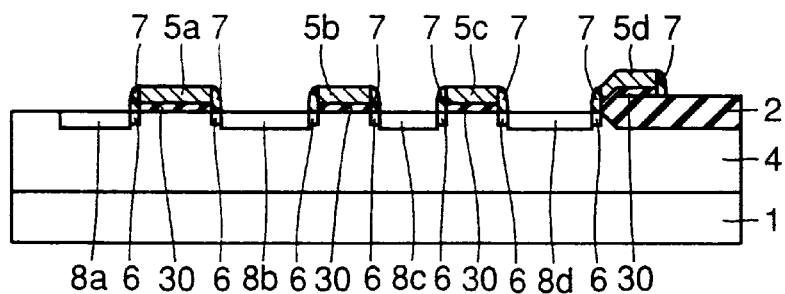
FIG. 10 is a cross section of the memory cell taken along line 100—100 in FIG. 9.

As shown in FIGS. 9 and 10, the surface of N$^-$-type silicon substrate 1 is thermally processed to form gate insulating film 30 which is made of the SiO$_2$ film and has a film thickness of about 40–100 Å. A gas of, e.g., phosphine (PH$_3$) is supplied to deposit a phosphorus doped polycrystalline silicon film, which has a phosphorus concentration of about 1.0–8.0×10$^{20}$ cm$^{-3}$ and a thickness of about 500–2000 Å, on gate insulating film 30 by an LPCVD (Low Pressure Chemical Vapor Deposition) method. This phosphorus doped polycrystalline silicon film forms the polycrystalline silicon film at the first level.

The aforementioned phosphorus doped polycrystalline silicon film and the underlying gate insulating film are patterned by a photolithography technique and a reactive ion etching (RIE) method. Thereby, word lines 5a and 5d, gate electrodes 5b and 5c of the driver transistors, and gate insulating film 30 are formed. The word lines 5a and 5d as well as gate electrodes 5b and 5c may be made of a so-called policide interconnection which is made of a metal silicide film such as a tungsten silicide (WSi$_2$) film and a phosphorus doped polycrystalline silicon film.

Thereafter, arsenic (As) is implanted at a dose of 1.0–5.0× 10$^{13}$ cm$^{-2}$ into a wafer which is being rotated, and more specifically is implanted at an implantation angle of 45 degrees with 30–70 KeV into the surface of N$^-$-type silicon substrate 1 masked with gate electrodes 5b and 5c as well as word lines 5a and 5d. Thereby, N$^-$-type source/drain regions 6 having an impurity concentration of about 10$^{17}$–10$^{19}$/cm$^3$ is formed. Further, an SiO$_2$ film (not shown) of about 500–2000 Å in thickness is deposited on the whole surface by the LPCVD method, and then is anisotropically etched by the RIE method. Thereby, side wall oxide films 7 of about 500–2000 Å in width are formed on the side surfaces of the word lines 5a and 5b as well as the side surfaces of gate electrodes 5b and 5c.

Thereafter, arsenic (As) is implanted at a dose of about 1.0–5.0×10$^{15}$ cm$^{-2}$ with 50 KeV into the main surface of N -type silicon substrate 1 masked with gate electrodes 5b and 5c, word lines 5a and 5d, and side wall oxide film 7. Thereby, N -type source/drain regions 8a–8d are formed. N$^+$-type source/drain regions thus formed have an impurity concentration of about 10$^{20}$–10$^{21}$ /cm$^3$. In this manner, the source/drain regions of the LDD structure formed of lightly doped N$^-$-type source/drain regions 6 and heavily doped N$^+$-type source/drain regions 8a–8d are formed.

Figure 11:
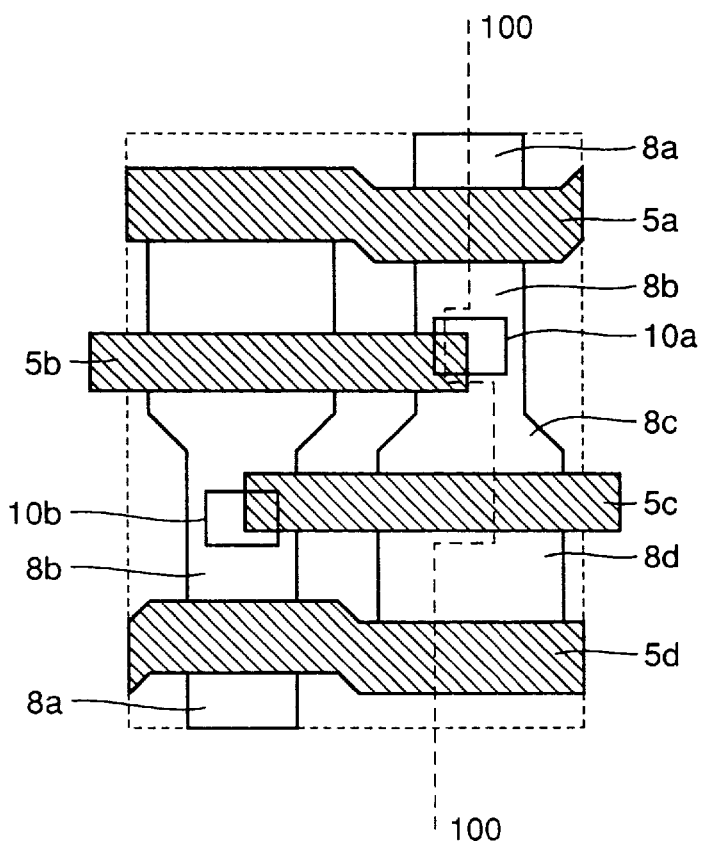
FIG. 11 shows a planar layout, and particularly shows a process of manufacturing the memory cell in the SRAM of the embodiment 1 of the invention.
Figure 12:
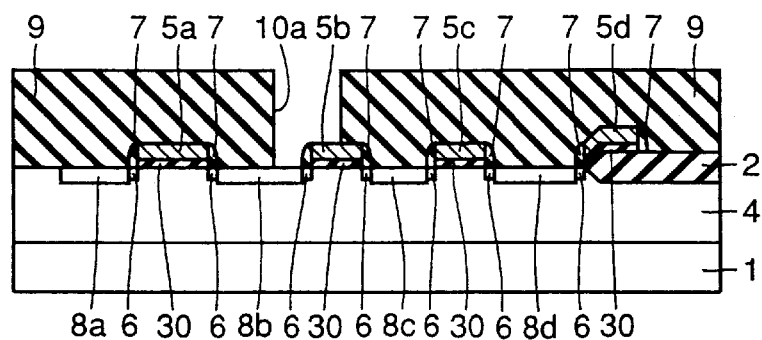
FIG. 12 is a cross section of the memory cell taken along line 100—100 in FIG. 11.

As shown in FIGS. 11 and 12, interlayer insulating film 9 formed of an SiO$_2$ film and having a thickness from about 1000 to about 10000 Å is formed on the whole surface by the LPCVD method. Predetermined regions of interlayer insulating film 9 are selectively removed by the photolithography and RIE method to form contact holes 10a and 10b which partially expose N$^+$-type source/drain regions 8b and gate electrodes 5b and 5c.

Natural oxide films which are formed on the exposed upper surfaces of gate electrodes 5b and 5c and the surfaces of source/drain regions 8b are removed with hydrofluoric acid (HF) or the like.

Thereafter, a polycrystalline silicon film (not shown) of about 200–1000 Å in thickness is deposited at the second level by the LPCVD method, and then is patterned by the photolithography and RIE method. Thereafter, ions of, e.g., phosphorus (P) are implanted into the polycrystalline silicon film at the second level with 30 KeV and at a dose from about 1.0×10$^{12}$ cm$^{-2}$ to about 1.0×10$^{14}$ cm$^{-2}$.

Figure 13:
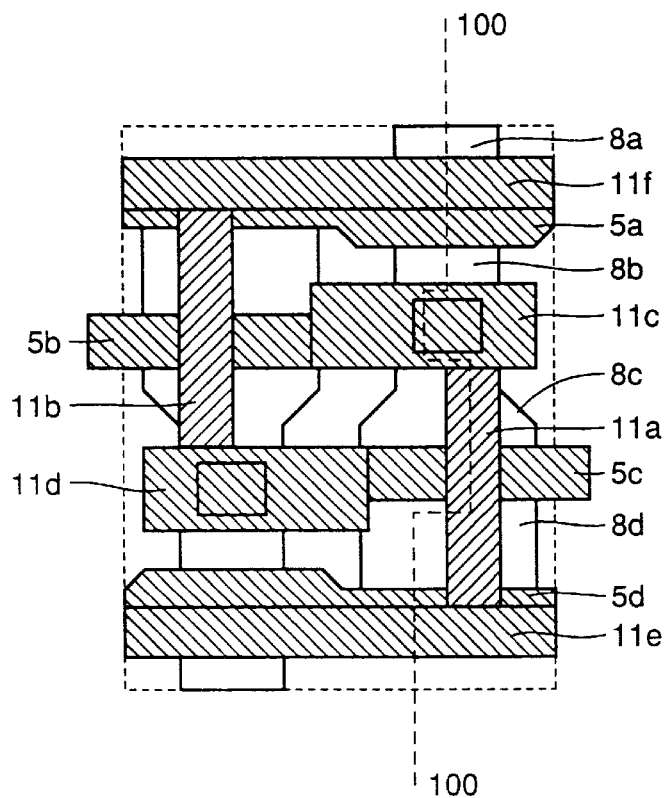
FIG. 13 shows a planar layout, and particularly shows a process of manufacturing the memory cell in the SRAM of the embodiment 1 of the invention.
Figure 14:
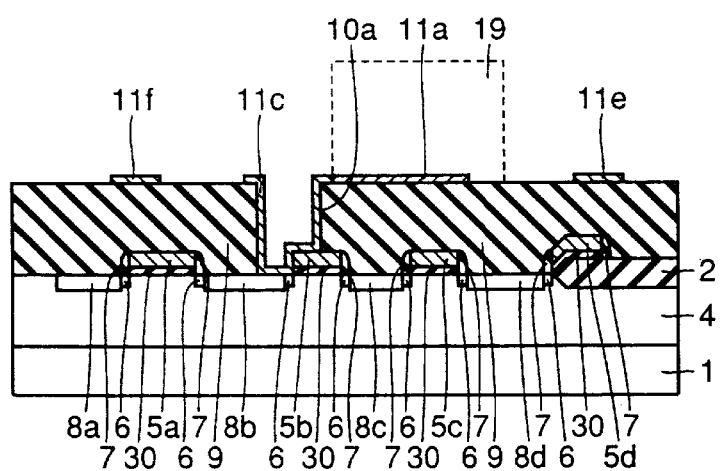
FIG. 14 is a cross section of the memory cell taken along line 100—100 in FIG. 13.

As shown in FIGS. 13 and 14, processing is performed to form a photoresist 19 which is patterned into a predetermined configuration by the photolithography. Using the photoresist 19 as a mask, impurity such as arsenic (As) is implanted into the polycrystalline silicon film at the second level with 20 KeV and at a dose from about 1.0×10$^{14}$ to about 1.0×10$^{15}$ cm$^{-2}$, so that storage node portions 11c and 11d as well as Vcc interconnection portions 11e and 11f which have a low resistance value are formed. Portions covered with photoresist 19 are not doped with the arsenic, so that these portions form high-resistance portions 11a and 11b having a high resistance value. High-resistance portions 11a and 11b have a resistance value from about 100 megaohm (MΩ) per line to about 10 teraohm (Te) per line, and the low-resistance portions (storage node portions 11c and 11d, and Vcc interconnection portions 11e and 11f) have a sheet resistance value from about 1 kiloohm (KΩ) per square to about 100 kiloohm per square. Through storage node portions 11c and 11d, gate electrodes 5b and 5c of the driver transistors are connected to N$^+$-type source/drain regions 8b.

Figure 15:
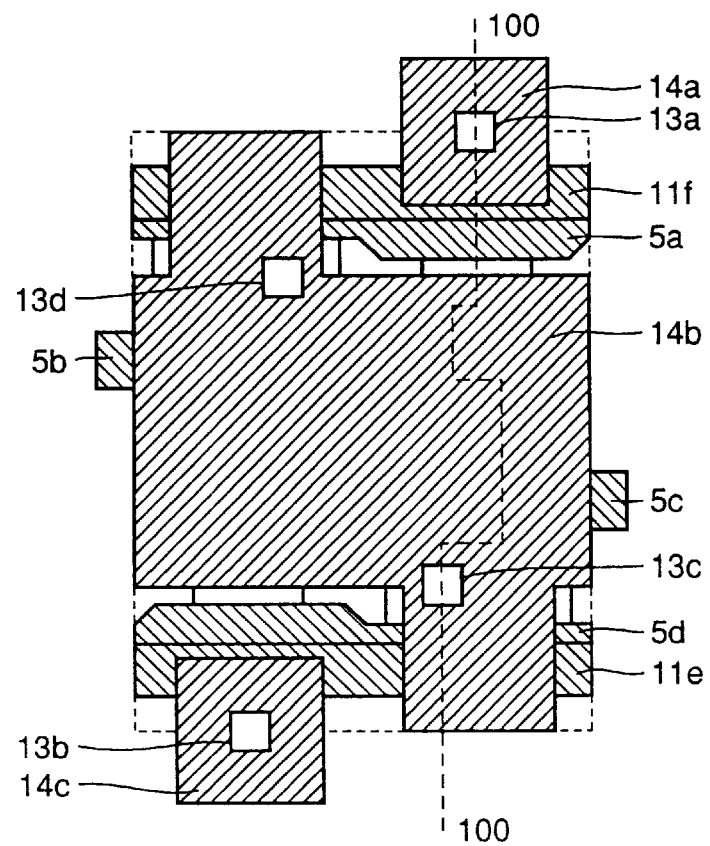
FIG. 15 shows a planar layout, and particularly shows a process of manufacturing the memory cell in the SRAM of the embodiment 1 of the invention.
Figure 16:
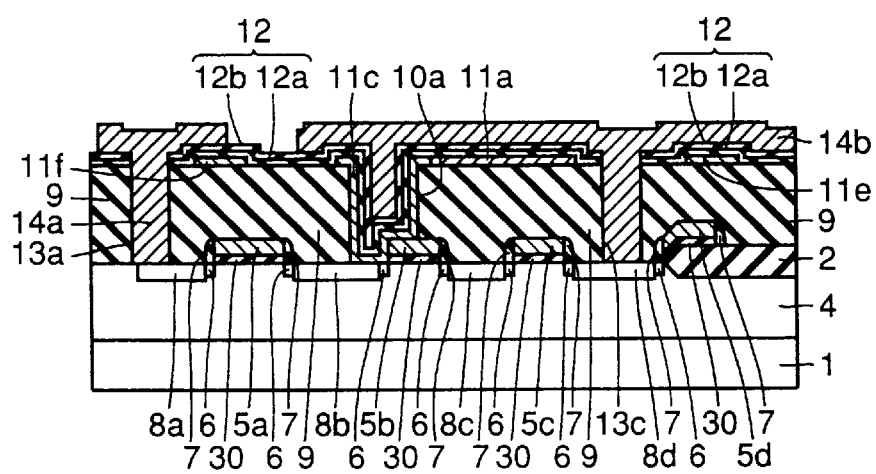
FIG. 16 is a cross section of the memory cell taken along line 100—100 in FIG. 15.

Thereafter, as shown in FIGS. 15 and 16, a silicon nitride film ($Si_3N_4$) 12a of about 50–200 Å in thickness is deposited, e.g., by the LPCVD method. At a temperature from about 750 to about 900 degree C, the surface of silicon oxide film 12a is oxidized in a hydrogen atmosphere, so that a silicon oxide film ($SiO_2$ or SiON) 12b is formed. Thereby, dielectric film 12 made of silicon nitride film 12a and silicon oxide film 12b is formed. The dielectric film 12 may be made of a single layer film such as an $SiO_2$ film or $Si_3N_4$ film instead of the two-layer film including $Si_3N_4$ film 12a and $SiO_2$ film 12b. A composite film formed of $SiO_2/Si_3N_4/SiO_2$ films or another dielectric film having a high dielectric constant may be used.

Thereafter, processing is performed to from bit line direct contact holes 13a and 13b as well as GND direct contact holes 13c and 13d by the photolithography and RIE method.

Processing is performed with hydrofluoric acid (HF) or the like to remove natural oxide films which are formed on N$^+$-type source/drain regions 8a exposed in bit line direct contact holes 13a and 13b as well as N$^+$-type source/drain regions 8b exposed in bit line direct contact holes 13c and 13d. Thereafter, the LPCVD method is performed to form the phosphorus doped polycrystalline silicon film (not shown) which forms the polycrystalline silicon film at the third level. The phosphorus doped polycrystalline silicon film thus formed has a thickness of about 1000–2000 Å and a phosphorus concentration of about $1.0–8.0 \times 10^{20}$ cm$^{-3}$. The phosphorus doped polycrystalline silicon film is patterned by the photolithography and RIE method to form bit line contact pads 14a and 14c as well as GND interconnection 14b.

In this embodiment, bit line contact pads 14a and 14c as well as GND interconnection 14b are made of only the phosphorus doped polycrystalline silicon film. Alternatively, the invention may employ a so-called policide interconnection formed of a metal silicide film such as a tungsten silicide film and a phosphorus doped polycrystalline silicon film.

Thereafter, as shown in FIGS. 1 and 2, interlayer insulating film 16 is formed, and bit line contact holes 17a and 17b are formed at predetermined regions of interlayer insulating film 16 by a process similar to that for an ordinary LSI. Processing is then performed to form bit lines 18a and 18b which are made of aluminum interconnections and are electrically connected to N$^+$-type source/drain regions 8a through bit line contact holes 17a and 17b, respectively.

In the manner described above, the memory cells in the SRAM of the embodiment 1 are completed.

(Embodiment 2)

Figure 21:
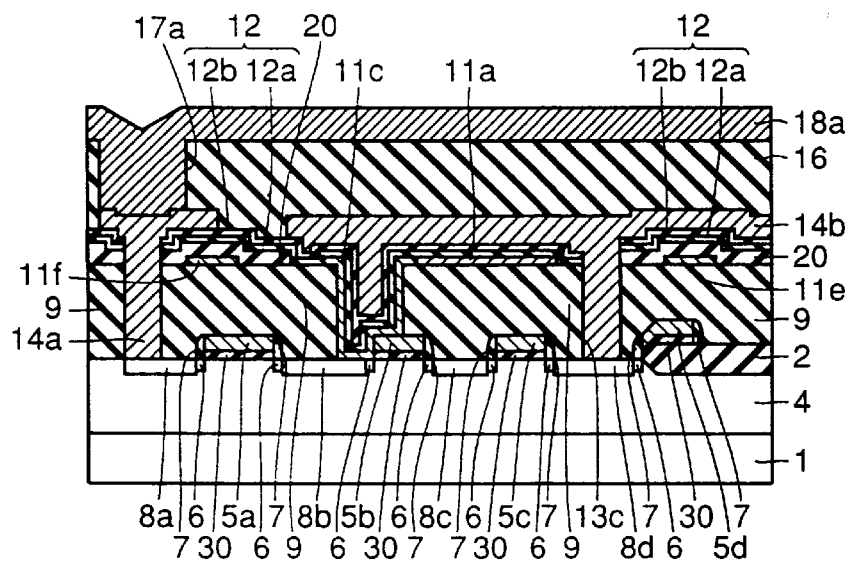
FIG. 21 is a cross section of the memory cell taken along line 100—100 in FIG. 20.

Referring first to FIG. 21, a structure of an embodiment 2 will be described below. The structure of the embodiment 2 has the basically same structure as that of the embodiment 1 shown in FIG. 2. However, the structure of the embodiment 2 is provided with an $SiO_2$ film 20 covering Vcc interconnections 11e and 11f. $SiO_2$ film 20 is covered with dielectric film 12. As described above, $SiO_2$ film 20 and dielectric film 12 cover the polycrystalline silicon film at the second level, i.e., Vcc interconnections 11e and 11f, so that dielectric film 12 and $SiO_2$ film form etching stopper films when overetching occurs during etching for patterning the third polycrystalline silicon film formed on dielectric film 12. In this case, removal of the etching stopper film by the overetching can be prevented more effectively than the case where only dielectric film 12 functions as the etching stopper film. Therefore, such a problem can be avoided that the etching stopper film disappears due to the overetching and thereby the polycrystalline silicon film at the second level breaks.

Figure 17:
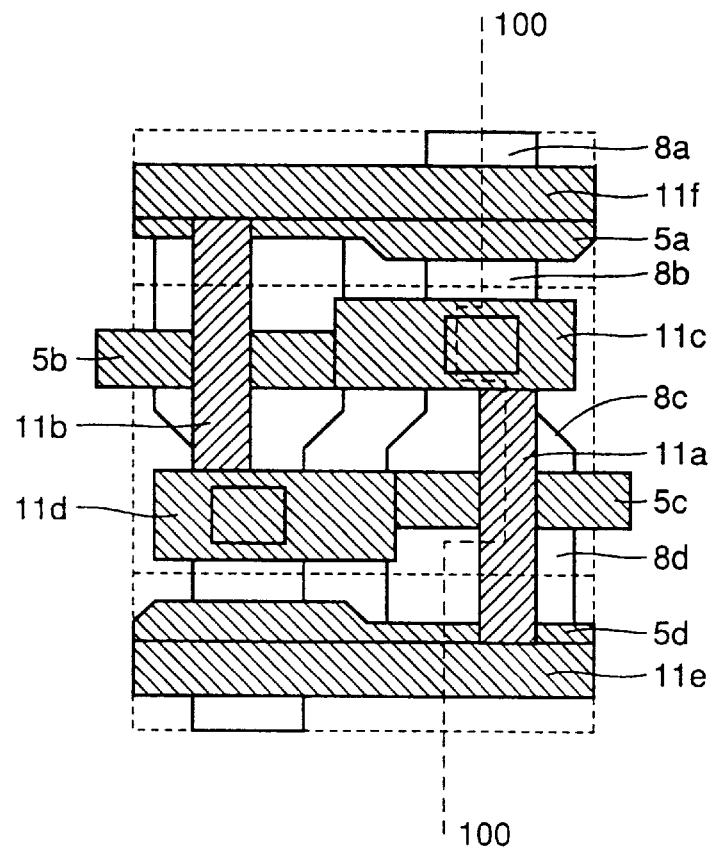
FIG. 17 shows a planar layout, and particularly shows a process of manufacturing a memory cell in an SRAM of an embodiment 2 of the invention.
Figure 18:
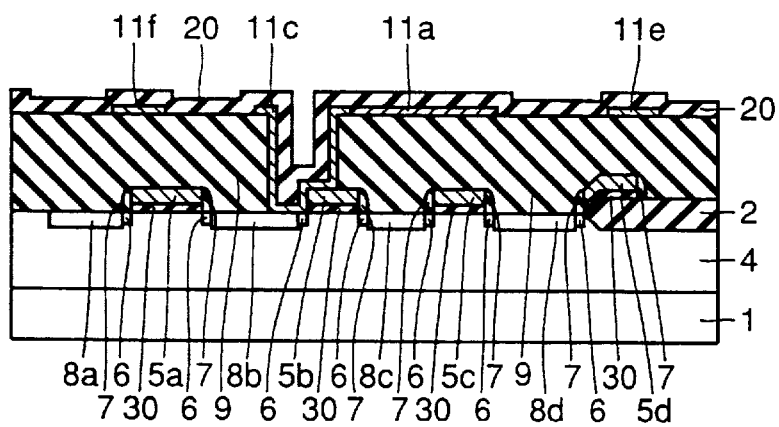
FIG. 18 is a cross section of the memory cell taken along line 100—100 in FIG. 17.
Figure 19:
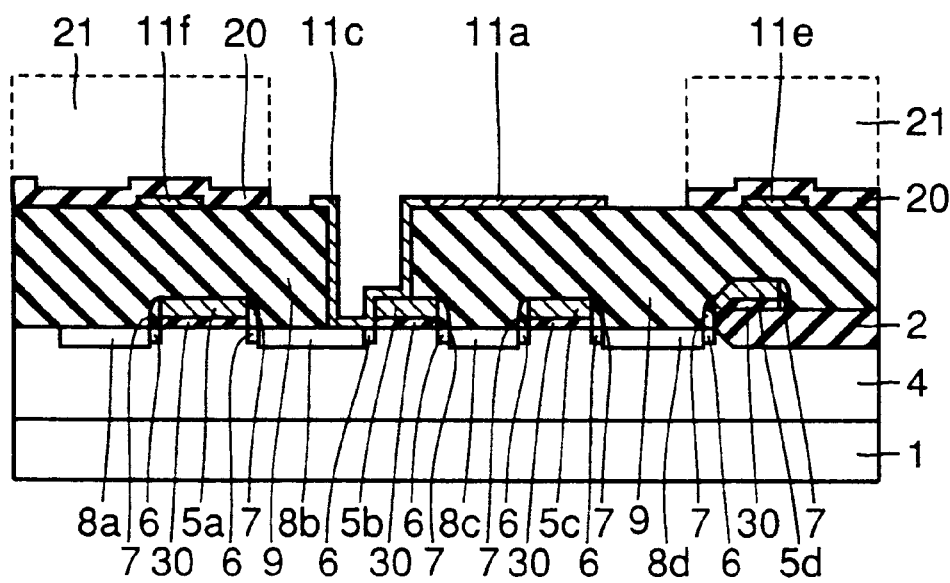
FIG. 19 is a cross section of the memory cell taken along line 100—100 in FIG. 17.
Figure 20:
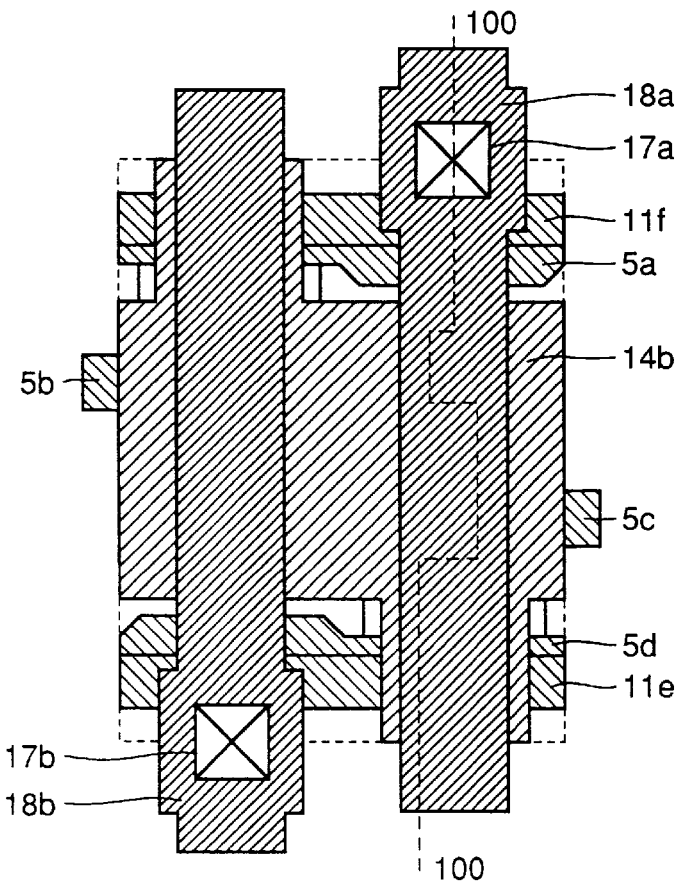
FIG. 20 shows a planar layout of the memory cell in the SRAM of the embodiment 2 of the invention.

Referring to FIGS. 17 to 19, a process of manufacturing the memory cells of the embodiment 2 will be described below. The process of manufacturing the memory cells of the embodiment 2 employs the same process as that of the embodiment 1 shown in FIGS. 7 to 14. Thereafter, as shown in FIGS. 17 and 18, $SiO_2$ film having a thickness of about 200–1000 Å is deposited on the whole surface. A photoresist 21 which is patterned into a predetermined configuration by the photolithography is formed at a predetermined region on $SiO_2$ film 20 as shown in FIG. 19. Using photoresist 21 as a mask, $SiO_2$ film 20 is dry-etched by the RIE method, so that patterned $SiO_2$ film 20 shown in FIG. 19 is formed. Thereafter, photoresist 21 is removed.

Similarly to the embodiment 1 already described, dielectric film 12 is formed as shown in FIG. 21. A polycrystalline silicon film at the third level is formed on dielectric film 12, and then is patterned. Thereby, GND interconnection 14b and bit line contact pad 14a are formed. During etching for patterning bit line contact pad 14a and GND interconnection 14b, the two films, i.e., $SiO_2$ film 20 and dielectric film 12 function as the etching stopper films. Thereby, removal of the etching stopper film is suppressed as compared with the case of the embodiment 1 in which only dielectric film 12 functions as the etching stopper film. Consequently, breakage of the Vcc interconnections 11e and 11f formed of the polycrystalline silicon film at the second level can be effectively prevented.

(Embodiment 3)

Figure 24:
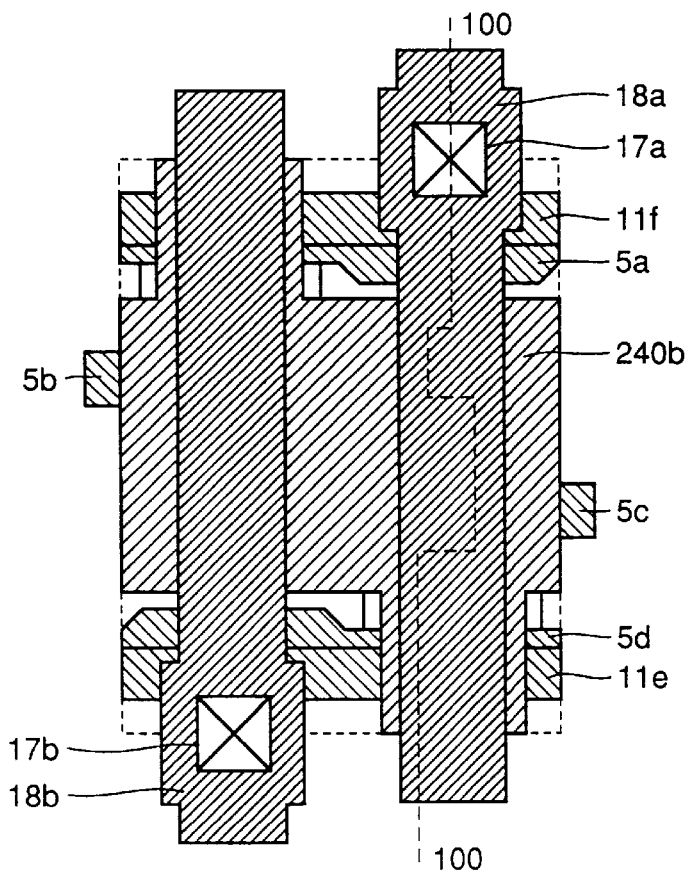
FIG. 24 shows a planar layout of the memory cell in the SRAM of the embodiment 3 of the invention.
Figure 25:
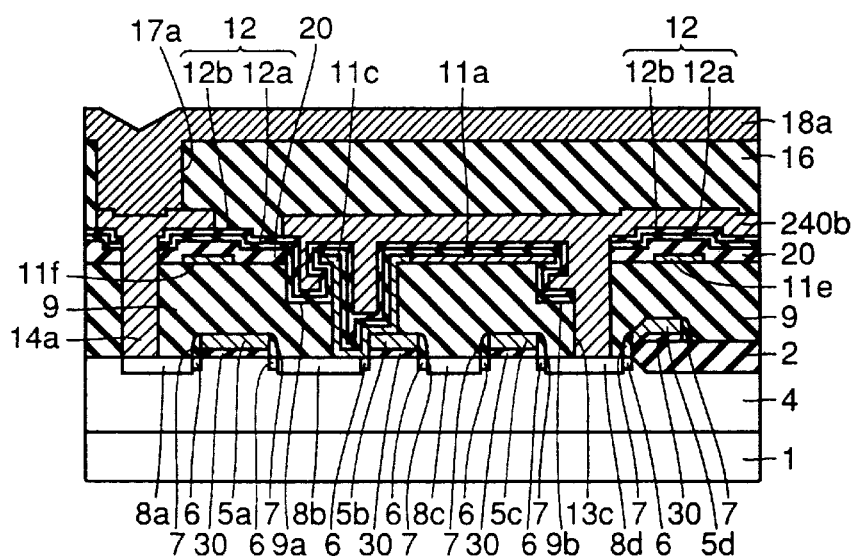
FIG. 25 is a cross section of the memory cell taken along line 100—100 in FIG. 24.

Referring to FIGS. 24 and 25, a structure of an embodiment 3 will be described below. This embodiment 3 is provided with $SiO_2$ film 20 covering Vcc interconnections 11e and 11f, similarly to the embodiment 2. In this embodiment 3, a GND interconnection 240b is formed along the upper, side and lower surfaces of storage node portion 11c and high-resistance portion 11a, which form the polycrystalline silicon film at the second level, with dielectric film 12 therebetween. This increases the surface area of the capacitor, which is formed of storage node portion 11a, dielectric film 12 and GND interconnection 240b, compared with the embodiments 1 and 2. Consequently, the storage node capacity can be further increased, and therefore the resistance against soft error can be further improved. Since the embodiment 3 is provided with $SiO_2$ film 20 similarly to the embodiment 2 already described, overetching, which may occur during patterning of GND interconnection 240b, i.e., the polycrystalline silicon film at the third level, does not expose the surfaces of underlying Vcc interconnections 11e and 11f, and therefore does not break them.

Figure 22:
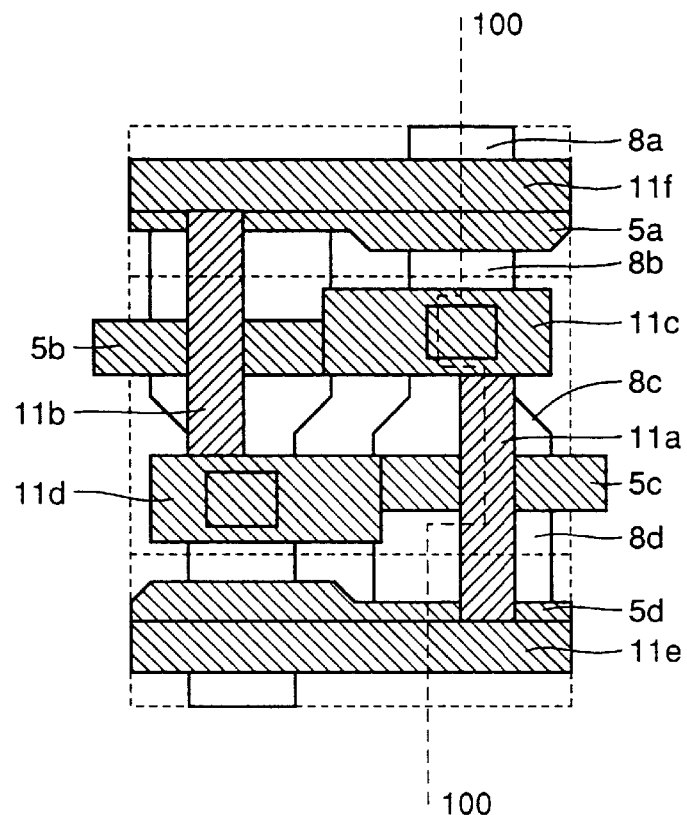
FIG. 22 shows a planar layout, and particularly shows a process of manufacturing a memory cell in an SRAM of an embodiment 3 of the invention.
Figure 23:
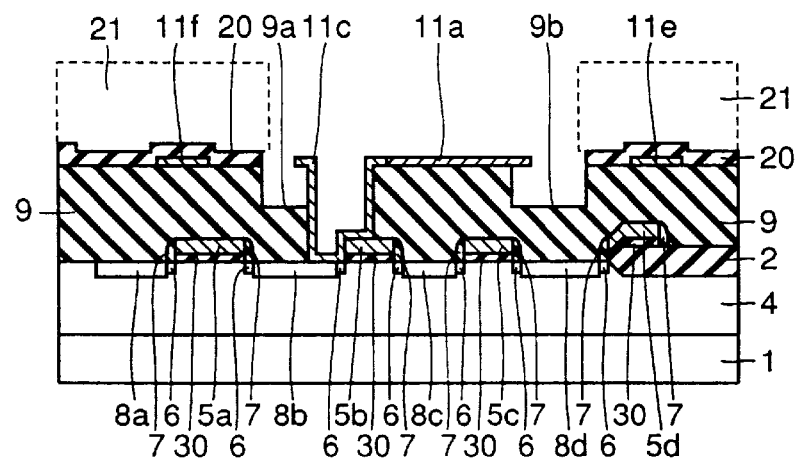
FIG. 23 is a cross section of the memory cell taken along line 100—100 in FIG. 22.

Referring to FIGS. 22 and 23, a manufacturing process of the embodiment 3 will be described below. In the manufacturing process of the embodiment 3, steps similar to those of the embodiment 2 shown in FIGS. 18 and 19 are performed. Then, as shown in FIGS. 22 and 23, $SiO_2$ film 20 and interlayer insulating film 9 formed of the $SiO_2$ film, which are masked with photoresist 21, are selectively removed with hydrofluoric acid (HF) or the like. Thereby, concavities 9a and 9b are formed at interlayer insulating film 9, so that side and bottom surfaces of storage node portion 11c and high-resistance portion 11a forming the polycrystalline silicon film at the second level are exposed. Thereafter, photoresist 21 is removed. Then, the structure of the embodiment 3 shown in FIG. 25 is completed through the process similar to those of the embodiments 1 and 2 already described. In this embodiment, dielectric film 12 and GND interconnection 240b are formed along the side, lower and upper surfaces of the exposed storage node portion 11c and high-resistance portion 11a, so that storage node portion 11c can have a remarkably increased storage capacity.

(Embodiment 4)

Figure 30:
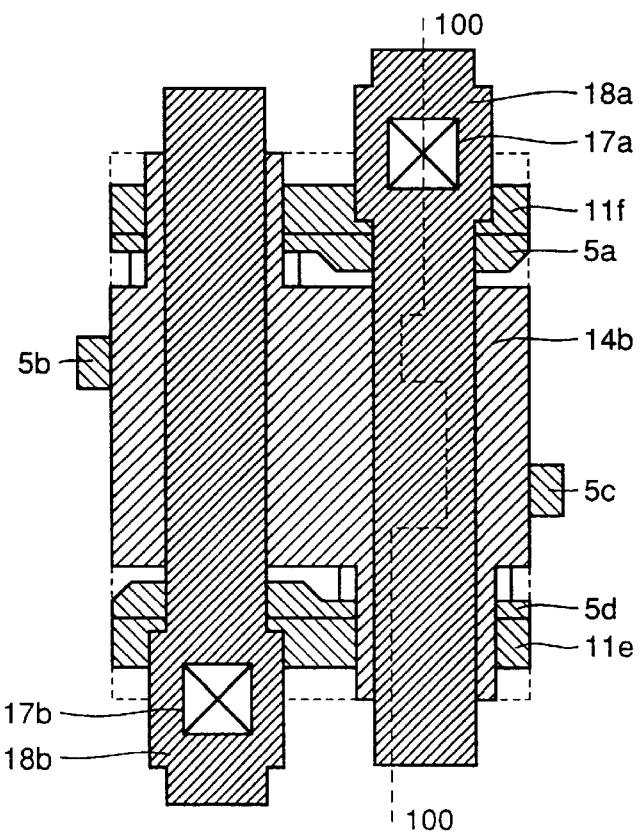
FIG. 30 shows a planar layout of the memory cell in the SRAM of the embodiment 4 of the invention.
Figure 31:
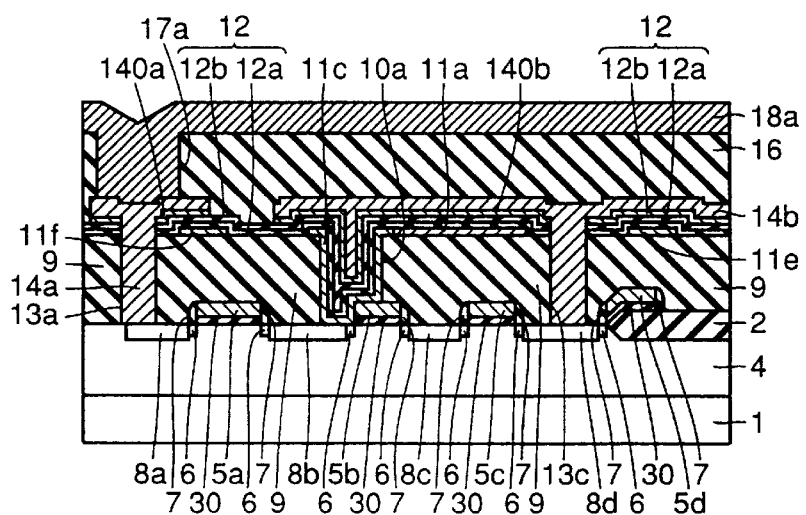
FIG. 31 is a cross section of the memory cell taken along line 100—100 in FIG. 30.

In a structure of an embodiment 4 shown in FIGS. 30 and 31, the polycrystalline silicon film at the third level has a two-layer structure. This two-layer film is patterned to form a bit line contact pad which is formed of polycrystalline silicon films 140a and 14a, and a GND interconnection which is formed of polycrystalline silicon films 140b and 14b. Owing to the two-layer structure of the polycrystalline silicon film at the third level, dielectric film 12 is protected by the lower layer of the polycrystalline silicon film at the third level during the operation of removing natural oxide films, which are formed at surfaces of N$^+$-type source/drain regions 8a and 8d in contact holes 13a and 13c, before forming the upper layer of the polycrystalline silicon film at the third level. Therefore, it is possible to prevent reduction in thickness of dielectric film 12 which may occur due to the process of removing the natural oxide films with hydrofluoric acid (HF) or the like before deposition of the upper layer of the polycrystalline silicon film at the third level. Thereby, such a disadvantage can be prevented that the etching stopper film disappear during patterning of the polycrystalline silicon film at the third level and thereby the polycrystalline silicon film at the second level is broken. Also, it is possible to stabilize the film thickness of dielectric film 12, so that the storage node capacity can be stabilized.

Figure 26:
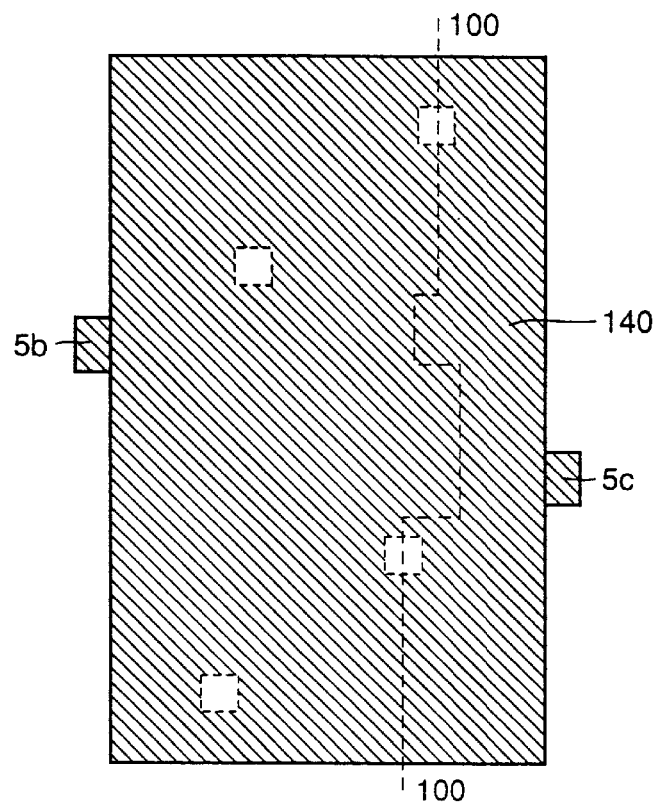
FIG. 26 shows a planar layout, and particularly shows a process of manufacturing a memory cell in an SRAM of an embodiment 4 of the invention.
Figure 27:
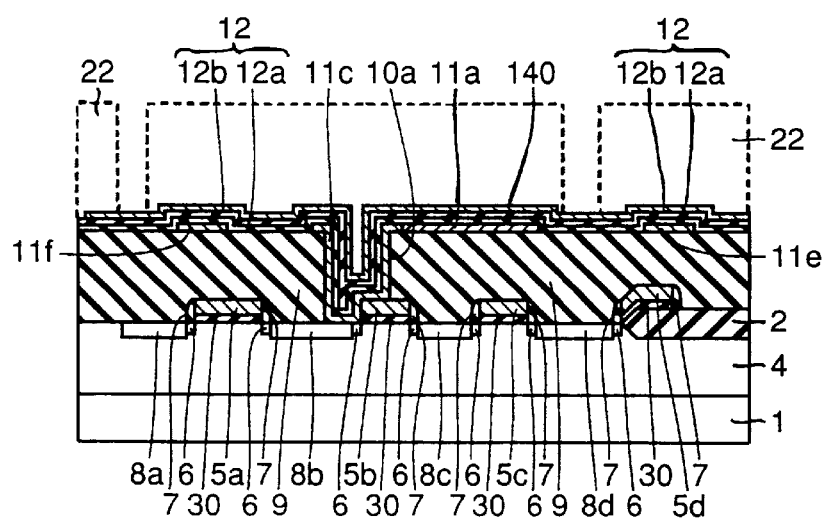
FIG. 27 is a cross section of the memory cell taken along line 100—100 in FIG. 26.

Referring to FIGS. 26 to 29, a manufacturing process of the embodiment 4 will be described below. In the manufacturing process of the embodiment 4, a process similar to that of the embodiment 1 shown in FIGS. 13 and 14 is performed to form the structure shown in FIG. 14. Then, as shown in FIGS. 26 and 27, dielectric film 12 is formed. A phosphorus doped polycrystalline silicon film 140, which will form the lower layer of the polycrystalline silicon film at the third level and has a film thickness of about 100–500 Å and a phosphorus concentration of about $1.0–8.0 \times 10^{20}$ cm$^{-3}$, is formed on dielectric film 12. A photoresist 22 is formed at a predetermined region on phosphorus doped polycrystalline silicon film 140 by the photolithography.

Figure 28:
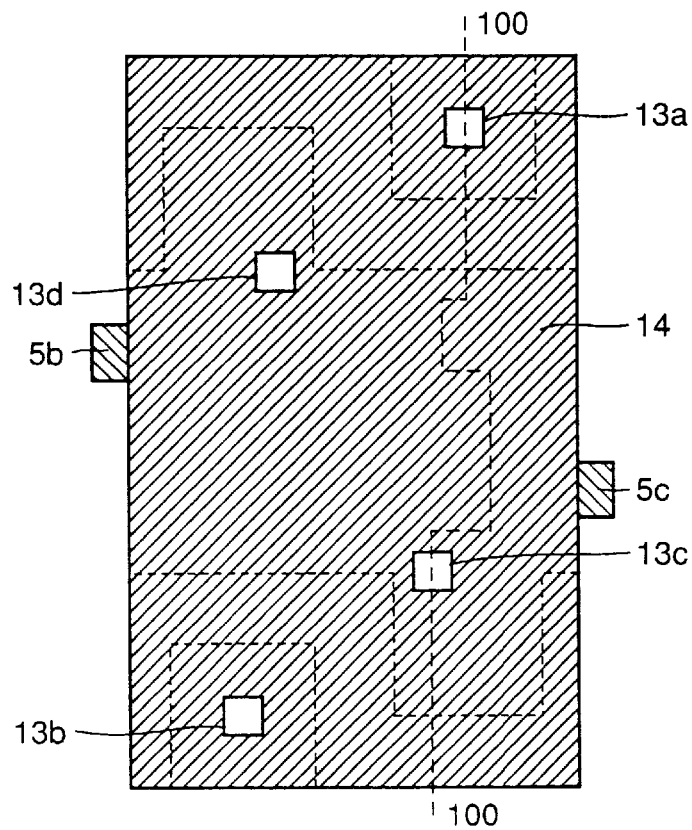
FIG. 28 shows a planar layout, and particularly shows a process of manufacturing the memory cell in the SRAM of the embodiment 4 of the invention.
Figure 29:
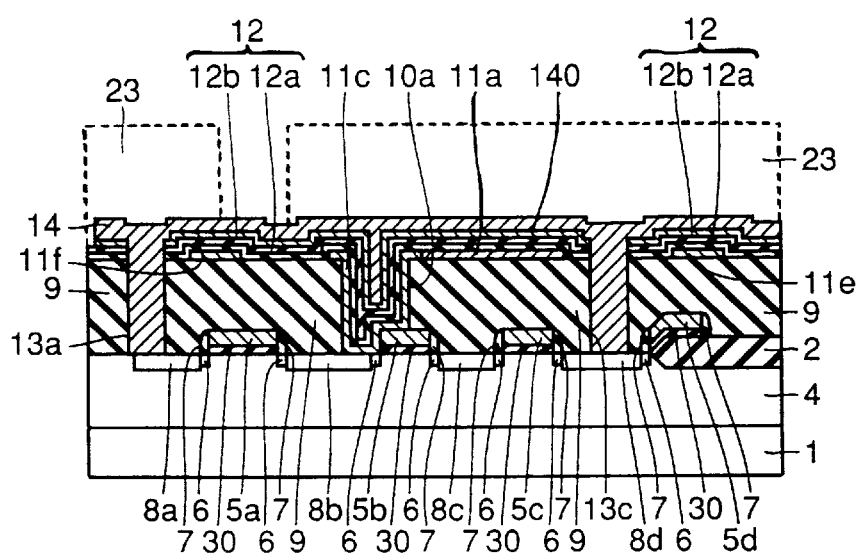
FIG. 29 is a cross section of the memory cell taken along line 100—100 in FIG. 28.

Interlayer insulating film 9 which is formed of phosphorus doped polycrystalline silicon film 140, dielectric film 12 and SiO$_2$ film is continuously etched, e.g., by the RIE method with a mask formed of photoresist 22. Thereby, as shown in FIGS. 28 and 29, bit line direct contact holes 13a and 13b as well as GND direct contact holes 13c and 13d are formed. After removing natural oxide films formed at the surfaces of contact holes 13a–13d with hydrofluoric acid (HF) or the like, phosphorus doped polycrystalline silicon film 14 is deposited on the whole surface. Phosphorus doped polycrystalline silicon film 14 thus formed has a thickness of about 1000–2000 Å and a phosphorus concentration of about $1.0–8.0 \times 10^{20}$ cm$^{-3}$. As described above, phosphorus doped polycrystalline silicon film 140 covers dielectric film 12 during the process of removing the natural oxide films with hydrofluoric acid (HF) or the like before depositing phosphorus doped polycrystalline silicon film 14. Therefore, such a disadvantage can be prevented that the film thickness of dielectric film 12 is reduced by hydrofluoric acid (HF) or the like. Accordingly, it is possible to prevent such a disadvantage that the polycrystalline silicon film at the second level is broken due to reduction in thickness of dielectric film 12 as described before, and it is possible to form dielectric film 12 having a stable thickness.

Thereafter, as shown in FIG. 29, a photoresist 23 is formed at a predetermined region on phosphorus doped polycrystalline silicon film 14. Using photoresist 23 as a mask, phosphorus doped polycrystalline silicon films 14 and 140 are patterned to form the bit line contact pad formed of phosphorus doped polycrystalline silicon films 140a and 14a as well as the GND interconnection formed of phosphorus doped polycrystalline silicon films 14b and 140b as shown in FIG. 31. Thereafter, a process similar to that of the embodiment 1 already described is performed to complete the memory cells of the embodiment 4 shown in FIGS. 30 and 31.

(Embodiment 5)

Figure 36:
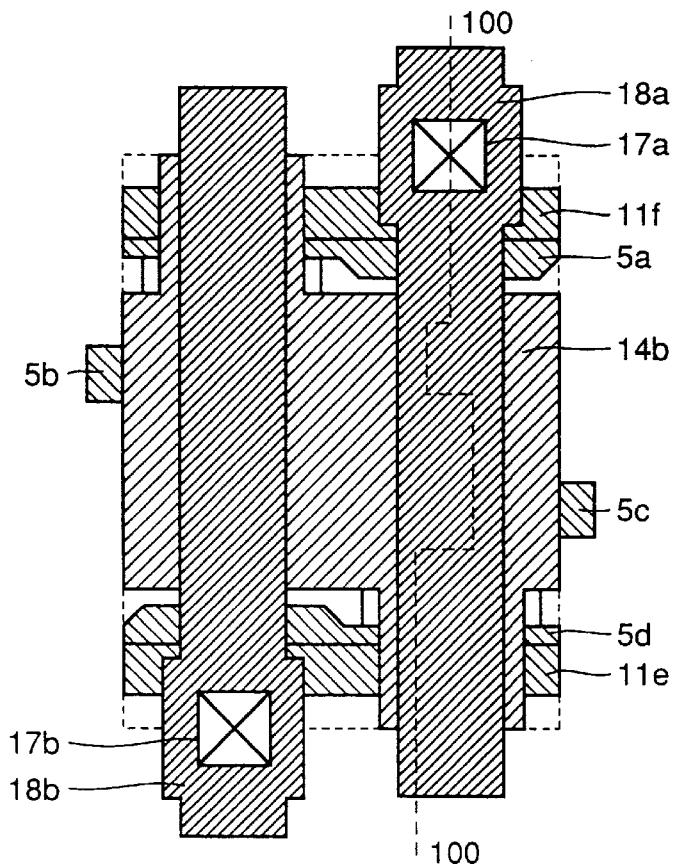
FIG. 36 shows a planar layout of the memory cell in the SRAM of the embodiment 5 of the invention.
Figure 37:
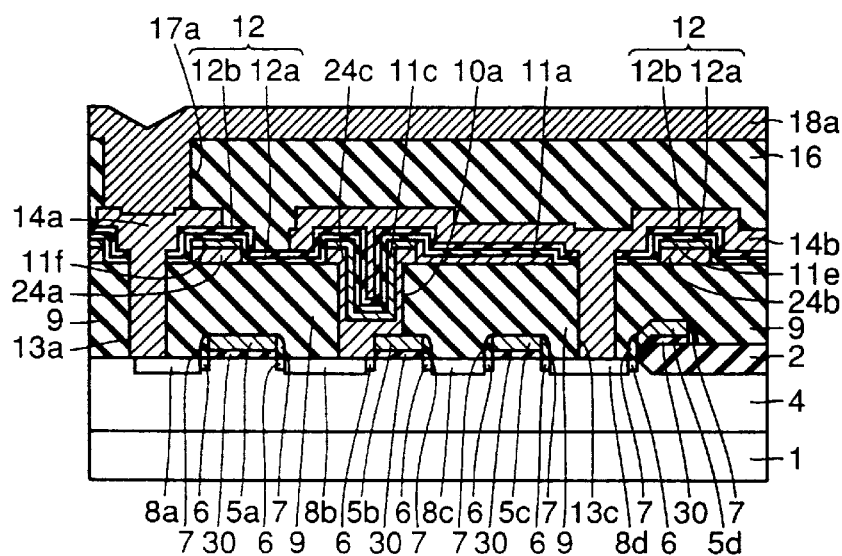
FIG. 37 is a cross section of the memory cell taken along line 100—100 in FIG. 36.
Figure 38:
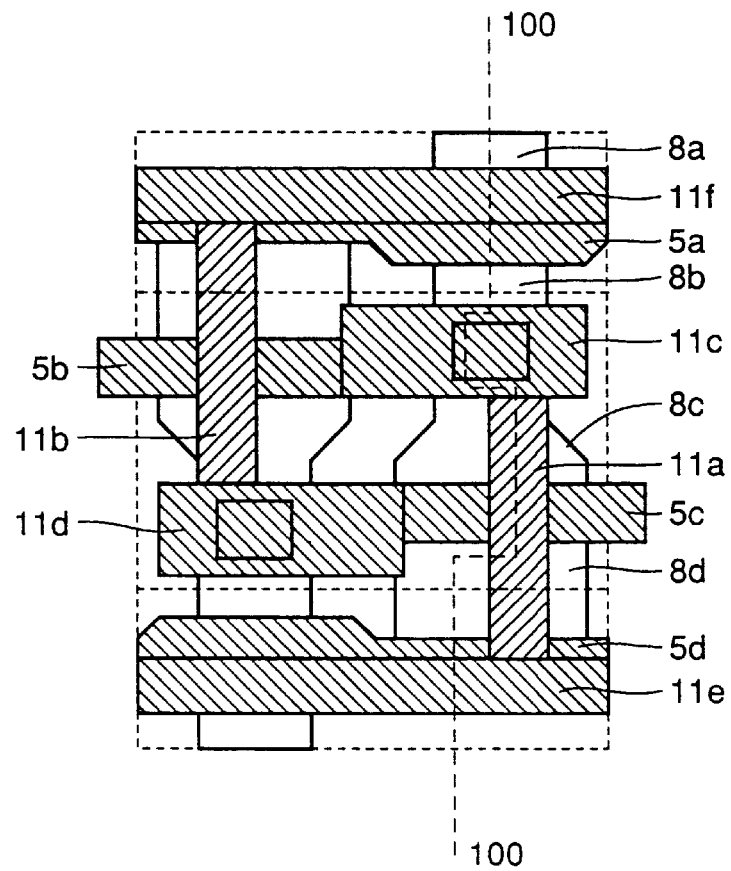
FIG. 38 shows a planar layout, and particularly shows a process of manufacturing a memory cell in an SRAM of an embodiment 6 of the invention.

Referring to FIGS. 36 and 37, a memory cell in an embodiment 5 includes a storage node portion and a Vcc interconnection portion, each of which has a two-layer structure. More specifically, the storage node portion is formed of a phosphorus doped polycrystalline silicon film 24c of about 500–1000 Å in thickness and an overlying polycrystalline silicon film 11c of about 200–1000 Å in thickness. The Vcc interconnections are formed of phosphorus doped polycrystalline silicon films 24a and 24b, and overlying polycrystalline silicon films 11f and 11e, respectively. GND interconnection 14b covers upper and side surfaces of the storage node portion formed of phosphorus doped polycrystalline silicon film 24c and polycrystalline silicon film 11c. Therefore, the capacitor formed at the side wall of the storage node portion can be longer than that in the structure in which the storage node portion is formed of only polycrystalline silicon film 11c. Thereby, the storage node portion can have an increased capacitor capacity.

Figure 32:
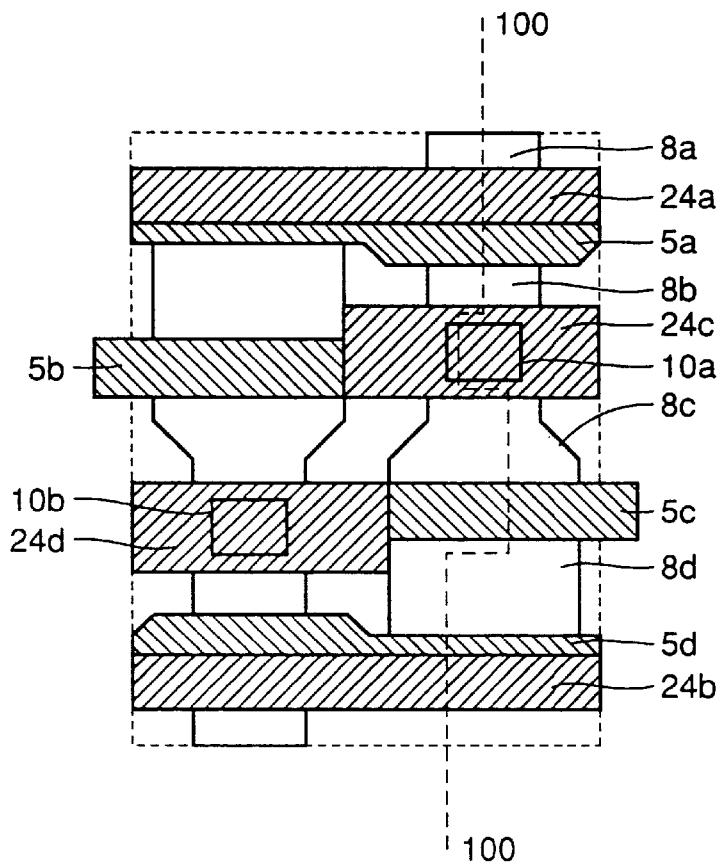
FIG. 32 shows a planar layout, and particularly shows a process of manufacturing a memory cell in an SRAM of an embodiment 5 of the invention.
Figure 33:
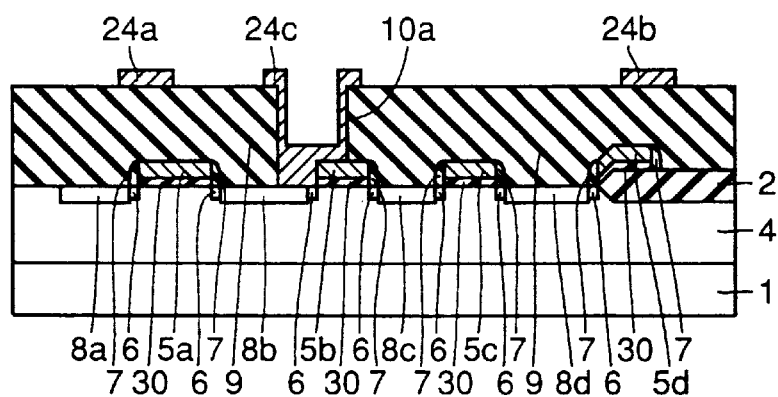
FIG. 33 is a cross section of the memory cell taken along line 100—100 in FIG. 32.

According to a method of manufacturing the memory cells of the embodiment 5, a process similar to that of the embodiment 1 shown in FIGS. 11 and 12 is performed, and then contact holes 10a and 10b are formed as shown in FIGS. 32 and 33. Thereafter, natural oxide films are removed with hydrofluoric acid (HF) or the like. The LPCVD method is performed to deposit the phosphorus doped polycrystalline silicon film which will form the polycrystalline silicon film at the second level and has a thickness of about 500–1000 Å and a phosphorus concentration of about 1.0— $8.0 \times 10^{20}$ cm$^{-3}$. The polycrystalline silicon film thus deposited is patterned by the photolithography and RIE method to form Vcc interconnections 24a and 24b as well as storage node connected interconnections 24c and 24d.

Figure 35:
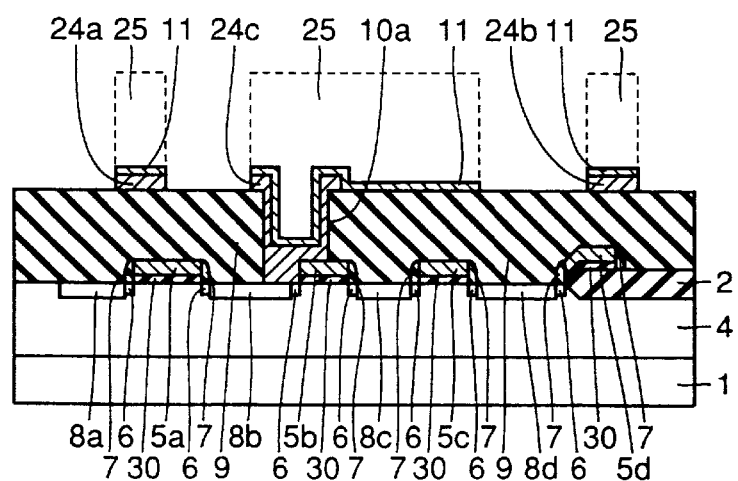
FIG. 35 is a cross section of the memory cell taken along line 100—100 in FIG. 34.

Thereafter, natural oxide films are removed with hydrofluoric acid (HF) or the like, and thereafter the polycrystalline silicon film at the third level having a thickness of about 200–1000 Å is deposited by the LPCVD method. Thereafter, a photoresist 25 is formed at a predetermined region on the polycrystalline silicon film at the third level as shown in FIG. 35, and then etching is effected on the polycrystalline silicon film at the third level masked with the photoresist 25 by the RIE method. Thereby, patterned polycrystalline silicon film 11 is formed at the third level as shown in FIG. 35. After removing photoresist 25, a process similar to that of the embodiment 1 already described is performed to complete the memory cells of the embodiment 5 shown in FIG. 37.

In the embodiment 5, as described above, the film thickness of the storage node portion is equal to the sum of the thicknesses of storage node interconnection 24c (24d) made of the polycrystalline silicon film at the second level and the storage node connecting portion 11c (11d) made of the polycrystalline silicon film at the third level. Therefore, the surface area of the capacitor formed of the storage node portion, dielectric film 12 and GND interconnection 14 is increased by an extent corresponding to the thickness of storage node connected interconnection 24c (24d). Accordingly, the capacity of the storage node portion can be further increased. Since the film thickness of the Vcc interconnection is equal to the sum of thicknesses of Vcc interconnection 24a (24b) and Vcc interconnection portion 11e (11f). Therefore, the interconnection resistance can be reduced.

In this embodiment 5, each of contact holes 10a and 10b has a diameter, which is larger than double the sum of the film thickness of storage node connected interconnection 24c or 24d and the thickness of storage node connected portion 11c, and is smaller than double the sum of the film thickness of storage node connected interconnection 24c or 24d, the film thickness of storage node connected portion 11a or 11c, the film thickness of dielectric film 12 and the film thickness of GND interconnection 14b. As described above, each of contact holes 10a and 10b has the diameter, which is larger than double the sum of the film thickness of storage node connected interconnection 24c or 24d and the thickness of storage node connected portion 11a or 11c.

Thereby, storage node connected portions 11c and 11d and the dielectric film 12 are formed along the inner wall surfaces of the contact holes 10a and 10b. Thereby, it is possible to increase remarkably the capacity of the capacitor which is formed of storage node connected portion 11c, dielectric film 12 and GND interconnection 14. Further, each of contact holes 10a and 10b has a diameter, which is smaller than double the sum of the film thickness of storage node connected interconnection 24c or 24d, the film thickness of storage node connected portion 11a or 11c, the film thickness of dielectric film 12 and the film thickness of GND interconnection 14b. Thereby, GND interconnection 14b can be formed to fill contact holes 10a and 10b with GND interconnection 14b. Therefore, the surface of GND interconnection 14b is flattened, so that bit lines 18a and 18b at the upper level can be patterned easily.

Each of GND direct contact holes 13c and 13d preferably has a diameter smaller than double the film thickness of GND interconnection 14b. According to this structure, GND direct contact holes 13c and 13d can be filled with GND interconnection 14b, so that GND interconnection 14b can have a further flattened surface. This allows easy patterning of, e.g., bit lines 18a and 18b at the upper level.

It is preferable to increase the film thickness of the polycrystalline silicon film at the second level forming storage node connected interconnections 24c and 24d. By increasing the film thickness of the polycrystalline silicon film at the second level, the capacity of the storage node can be increased by an extent corresponding to the increased thickness.

(Embodiment 6)

Figure 41:
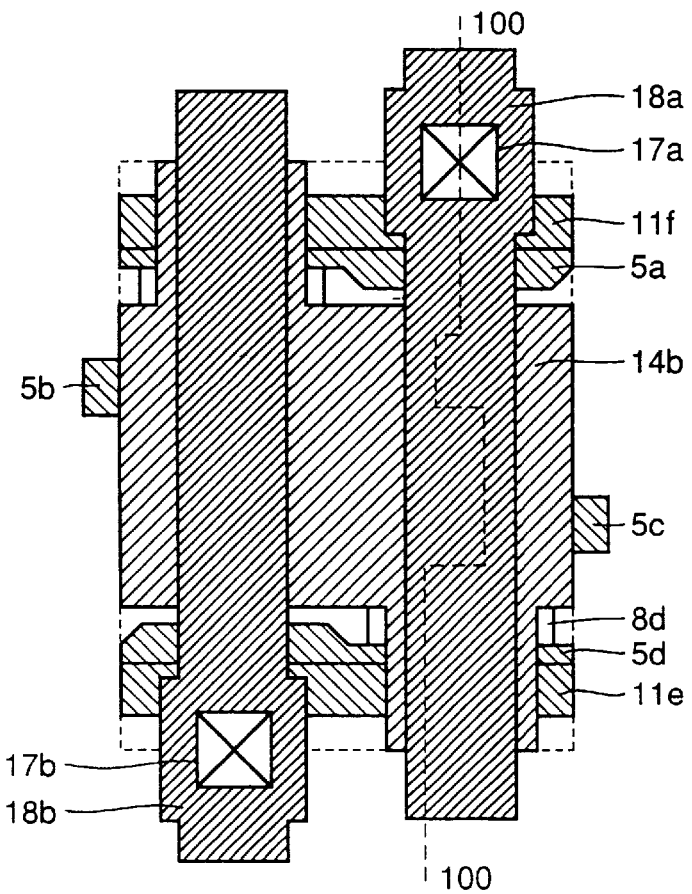
FIG. 41 shows a planar layout of the memory cell in the SRAM of the embodiment 6 of the invention.
Figure 42:
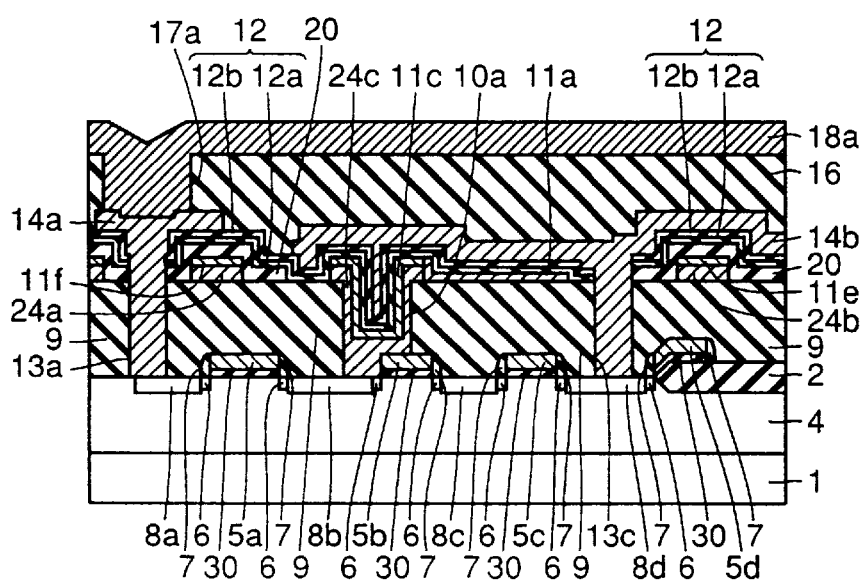
FIG. 42 is a cross section of the memory cell taken along line 100—100 in FIG. 41.
Figure 43:
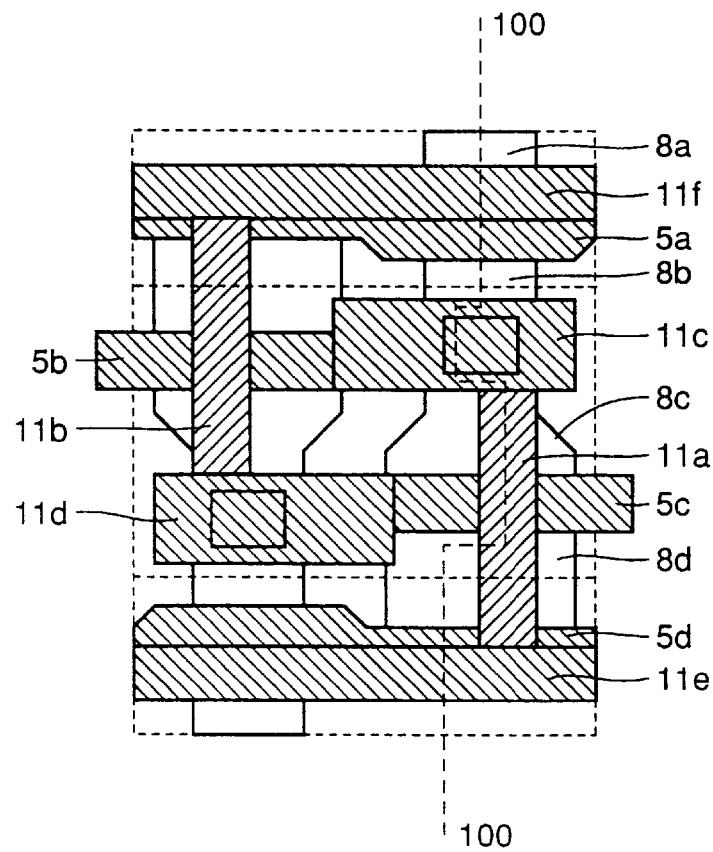
FIG. 43 shows a planar layout, and particularly shows a process of manufacturing a memory cell in an SRAM of an embodiment 7 of the invention.
Figure 44:
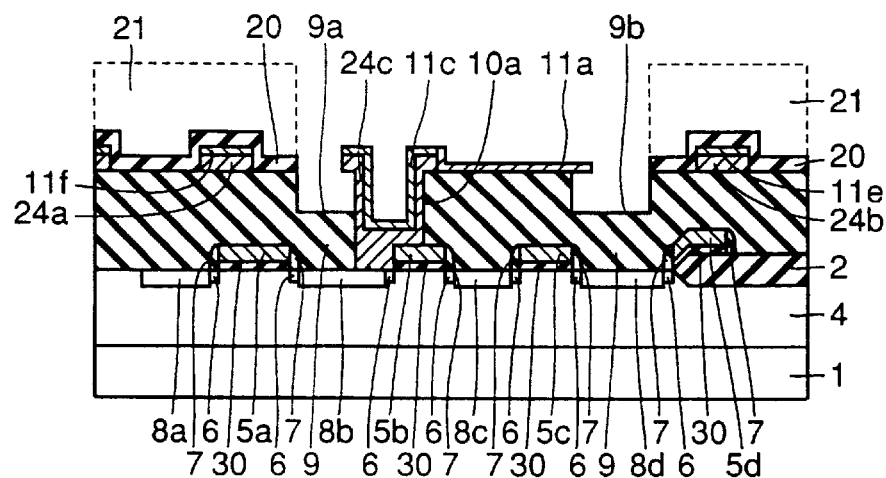
FIG. 44 is a cross section of the memory cell taken along line 100—100 in FIG. 43.

Referring to FIGS. 41 and 42, a structure of a memory cell of an embodiment 6 employs a structure similar to that of the embodiment 5 already described, and additionally employs $SiO_2$ film 20 in the embodiment 2. Therefore, the embodiment 6 can achieve both the effects of the embodiments 2 and 5.

Figure 39:
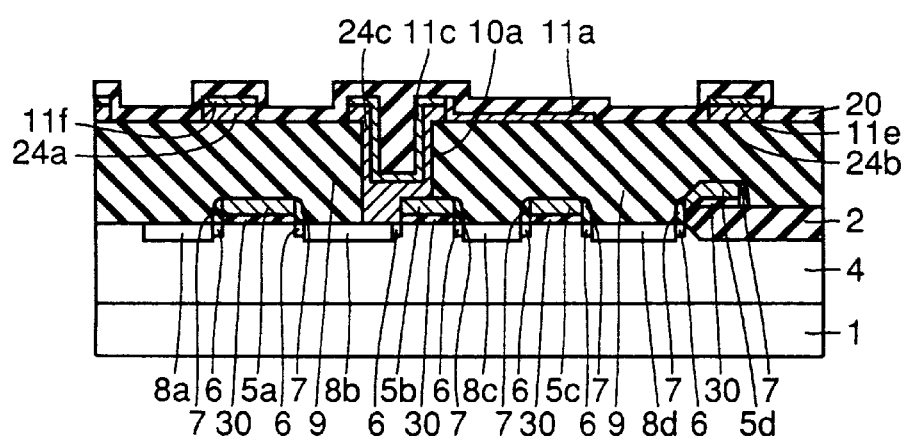
FIG. 39 is a cross section of the memory cell taken along line 100—100 in FIG. 38.
Figure 40:
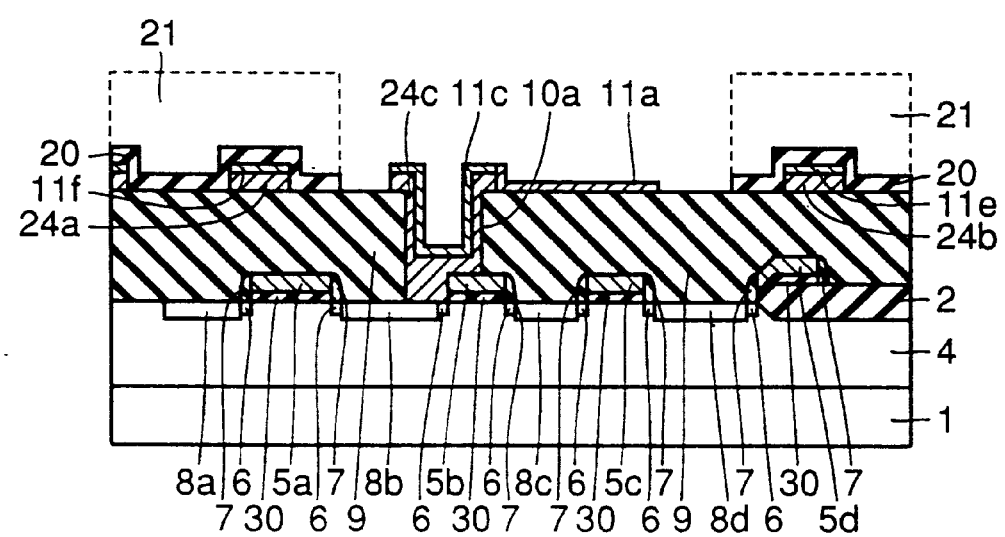
FIG. 40 is a cross section of the memory cell taken along line 100—100 in FIG. 38.

According to a manufacturing process of the embodiment 6, a process similar to that of the embodiment 5 shown in FIGS. 32 to 35 is performed. Thereafter, $SiO_2$ film 20 of about 200–1000 Å in thickness is deposited on the whole surface as shown in FIG. 39. A photoresist 21 shown in FIG. 40 is formed at a predetermined region on $SiO_2$ film 20 by the photolithography, and then $SiO_2$ film 20 is partially and selectively removed by the RIE method using photoresist 21 as a mask. Thereby, patterned $SiO_2$ film 20 is formed as shown in FIG. 40. Thereafter, photoresist 21 is removed.

Through a process similar to that of the embodiment 5, a memory cell structure of the embodiment 6 is completed as shown in FIG. 42.

In this embodiment 6, $SiO_2$ film 20 and dielectric film 12 can both function as the etching stoppers during formation of GND interconnection 14b. Therefore, the etching stopper film does not disappear even if overetching occurs during formation of GND interconnection 14b, and therefore disadvantages such as breakage of Vcc interconnection 11f can be prevented. Thus, an effect similar to that of the embodiment 2 can be achieved.

(Embodiment 7)

Figure 45:
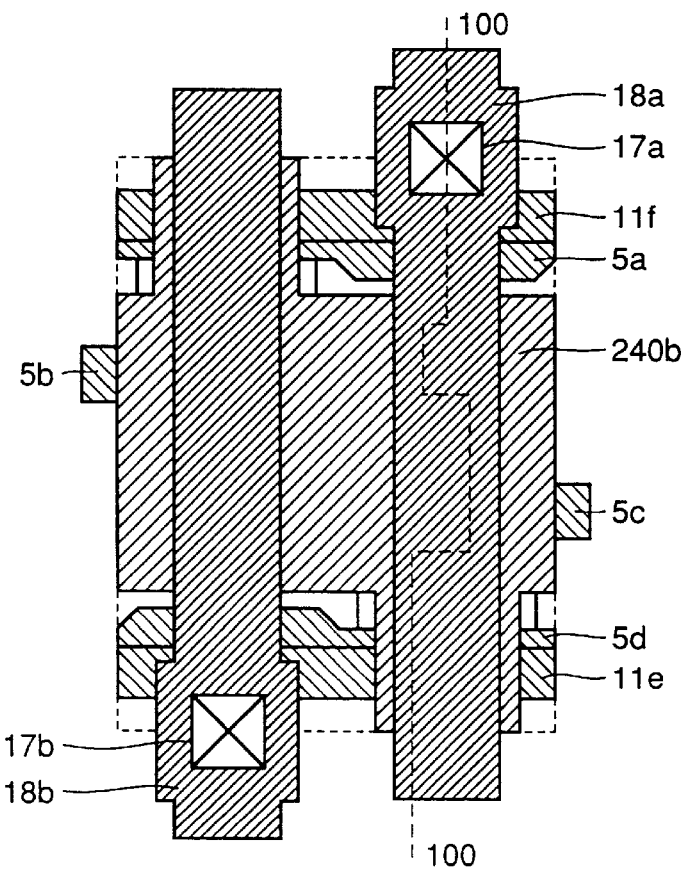
FIG. 45 shows a planar layout of the memory cell in the SRAM of the embodiment 7 of the invention.
Figure 46:
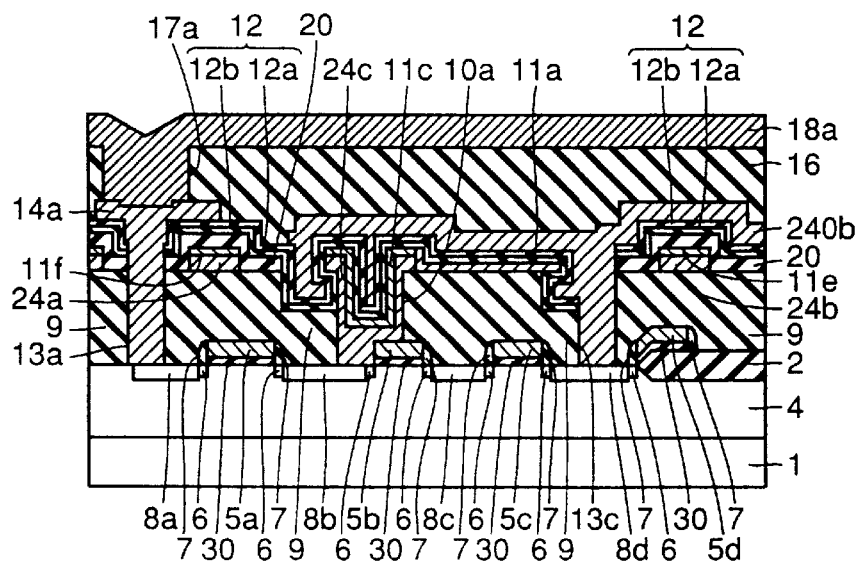
FIG. 46 is a cross section of the memory cell of the embodiment 7 taken along line 100—100 in FIG. 45.
Figure 47:
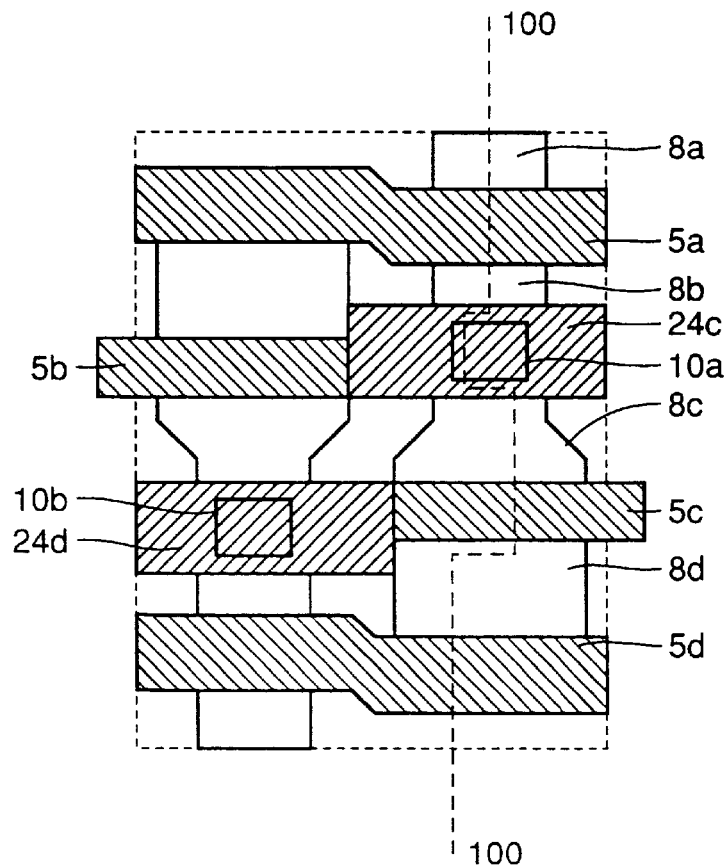
FIG. 47 shows a planar layout, and particularly shows a process of manufacturing a memory cell in an SRAM of an embodiment 8 of the invention.
Figure 48:
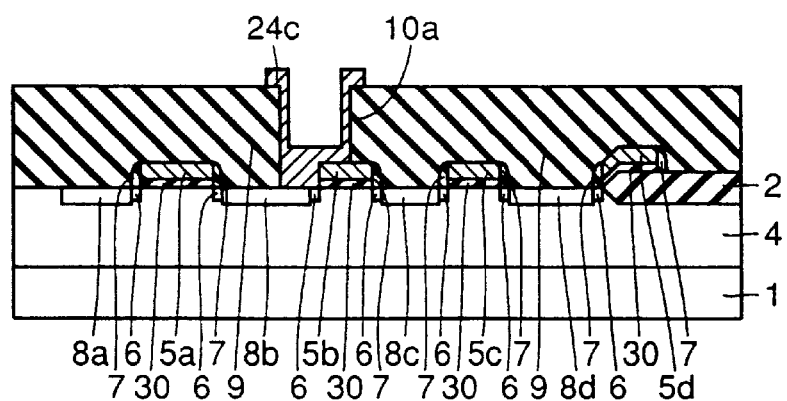
FIG. 48 is a cross section of the memory cell taken along line 100—100 in FIG. 47.
Figure 49:
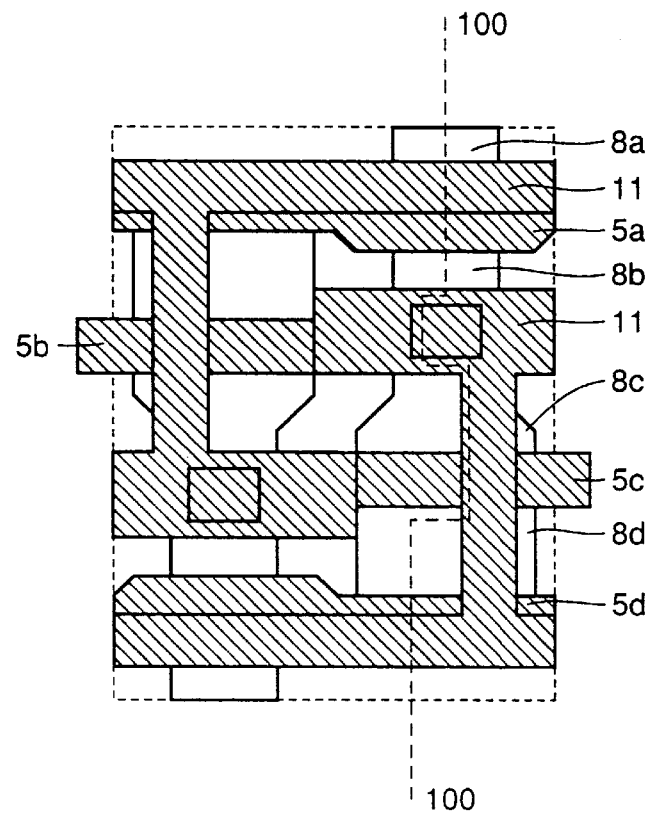
FIG. 49 shows a planar layout, and particularly shows a process of manufacturing the memory cell in an SRAM of the embodiment 8 of the invention.

Referring to FIGS. 45 and 46, a structure of the embodiment 7 employs the structure of the embodiment 5 and additionally employs the structure of the embodiment 3. More specifically, the storage node portion has a two-layer structure formed of storage node connected interconnection 24c and storage node portion 11c, and dielectric film 12 is formed not only on the upper and side surfaces of the storage node portion but also on the lower surface thereof. This structure can increase the storage capacity of the storage node portion, and thereby the resistance against soft error can be improved.

According to a process of manufacturing the memory cell of the embodiment 7, a process similar to that of the embodiment 6 shown in FIGS. 39 and 40 is first performed.

Thereafter, $SiO_2$ film 20 and interlayer insulating film 9 made of the $SiO_2$ film are partially and selectively removed with hydrofluoric acid (HF) or the like using photoresist 21 as a mask. Thereby, concavities 9a and 9b are formed, so that the outer side surface and lower surface of storage node connected interconnection 24c forming the storage node portion is exposed. After dielectric film 12 is formed along the exposed lower and side surfaces as shown in FIG. 46, concavities 9a and 9b are filled with GND interconnection 240b, so that the storage node portion can have a remarkably increased capacity. Thus, an effect similar to that of the embodiment 3 can be achieved. $SiO_2$ film 20 can prevent such a problem that the etching stopper film disappears and thereby the polycrystalline silicon film at the second level is broken during etching for patterning GND interconnection 240b.

(Embodiment 8)

Figure 51:
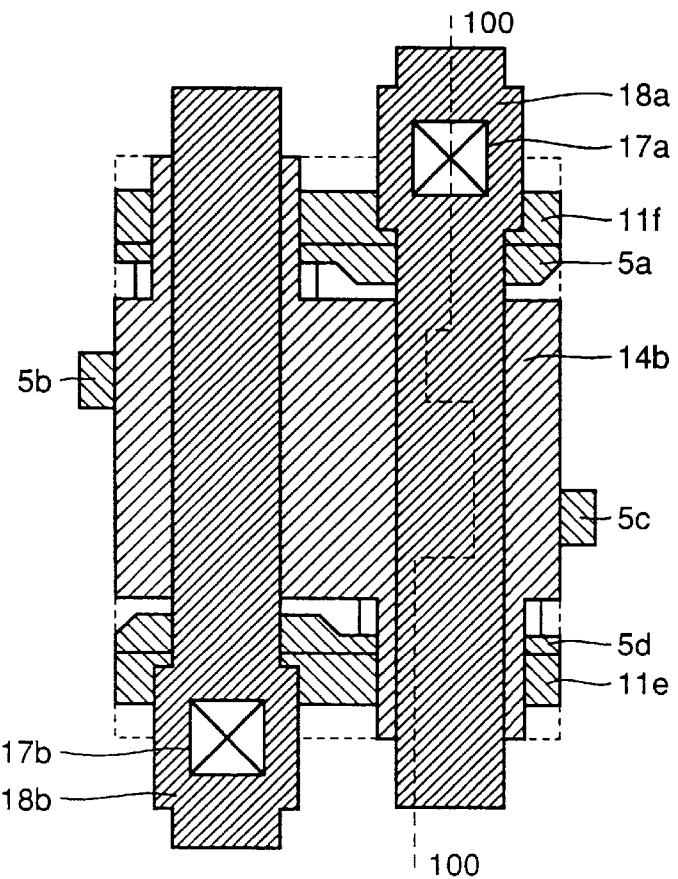
FIG. 51 shows a planar layout of the memory cell in the SRAM of the embodiment 8 of the invention.
Figure 52:
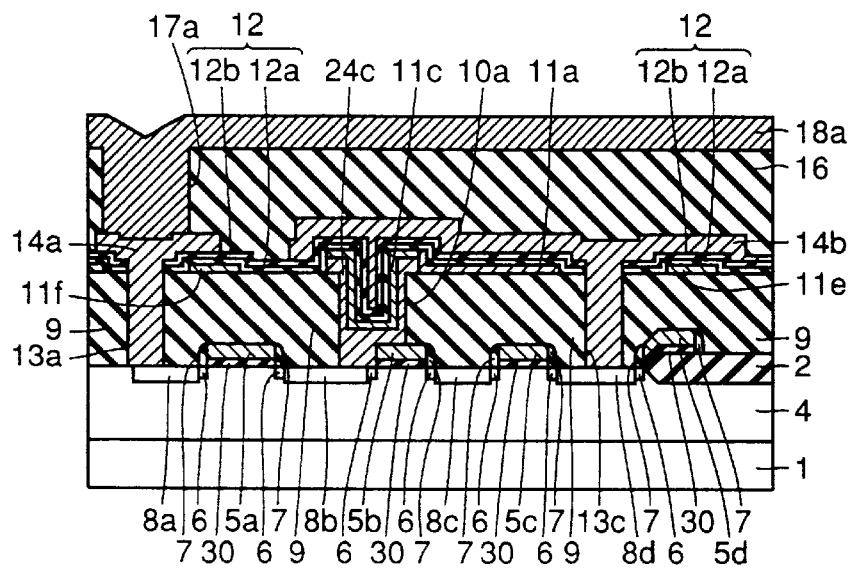
FIG. 52 is a cross section of the memory cell taken along line 100—100 in FIG. 51.

Referring to FIGS. 51 and 52, an embodiment 8 is a modification of the embodiment 5 already described. In the embodiment 5, each of the Vcc interconnection and the storage node portion has the two-layer structure. In the embodiment 8, however, each of Vcc interconnections 11e and 11f is formed of a single layer, and the storage node portion has a two-layer structure formed of storage node connected interconnection 24c and storage node portion 11c.

According to the structure in which only the storage node portion has the two-layer structure, the length of the side surface is increased at the upper portion of the storage node portion of the two-layer structure, and therefore the storage node can have an increased capacity similarly to the embodiment 5.

Figure 34:
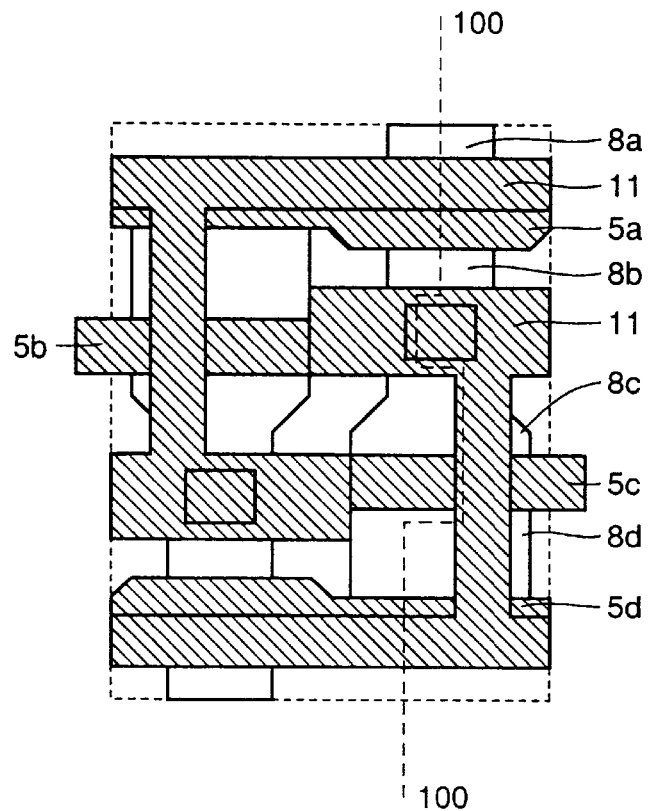
FIG. 34 shows a planar layout, and particularly shows a process of manufacturing the memory cell in the SRAM of the embodiment 5 of the invention.
Figure 50:
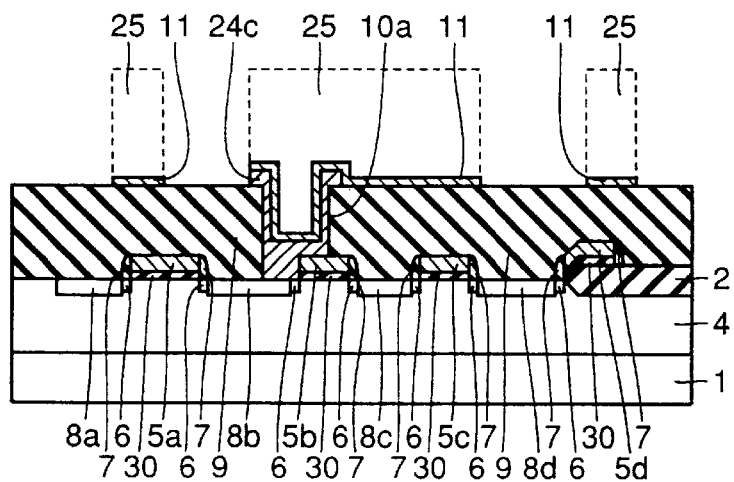
FIG. 50 is a cross section of the memory cell taken along line 100—100 in FIG. 49.

A manufacturing process of the embodiment 8 differs from that of the embodiment 5 shown in FIGS. 34 and 35 in that patterning of the polycrystalline silicon film at the second level is performed to form only storage node connected interconnections 24c and 24d without forming Vcc interconnections 24a and 24b. Thereafter, the natural oxide films at the upper surfaces of storage node connected interconnections 24c and 24d are removed with hydrofluoric acid (HF) or the like, and then the LPCVD method is performed to form the polycrystalline silicon film of about 200–1000 Å at the third level. A photoresist 25 is formed at a predetermined region on the polycrystalline silicon film at the third level by the photolithography, as shown in FIG. 50. Using photoresist 25 as a mask, dry etching is effected on the polycrystalline silicon film at the third level by the RIE method, so that patterned polycrystalline silicon film 11 at the third level is formed as shown in FIG. 50. Thereafter, photoresist 25 is removed, and impurity is implanted into a predetermined region of the polycrystalline silicon film at the third level, so that Vcc interconnections 11e and 11f, storage node portion 11c and high-resistance portion 11a are formed as shown in FIG. 52. Thereafter, a process similar to that of the embodiment 5 is performed to complete the memory cell of the embodiment 8 as shown in FIG. 52.

(Embodiment 9)

Figure 57:
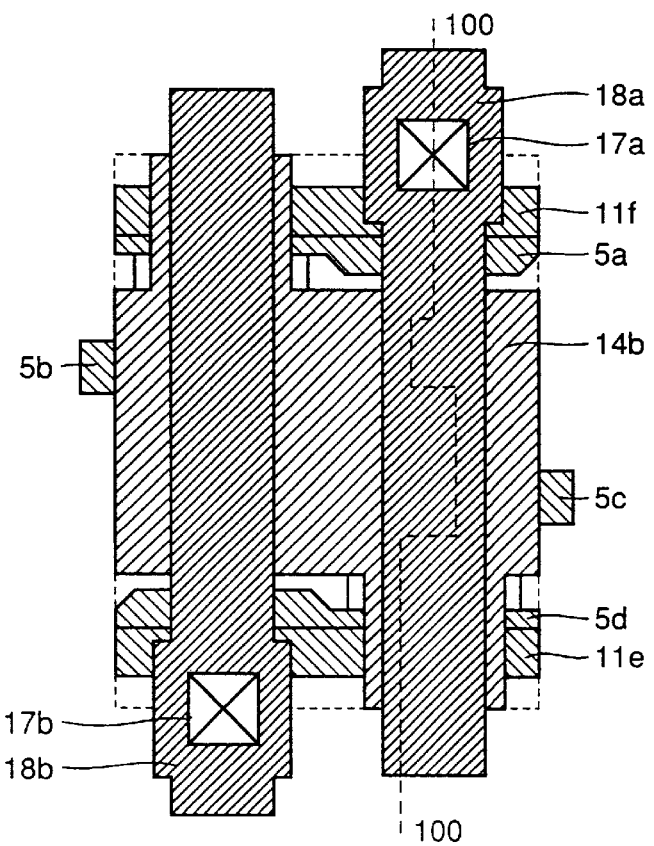
FIG. 57 shows a planar layout of the memory cell in the SRAM of the embodiment 9 of the invention.
Figure 58:
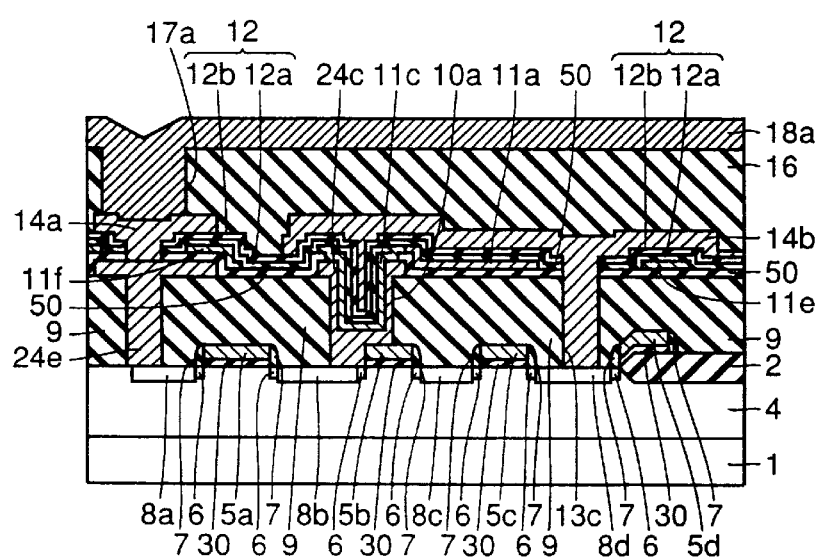
FIG. 58 is a cross section of the memory cell taken along line 100—100 in FIG. 57.
Figure 59:
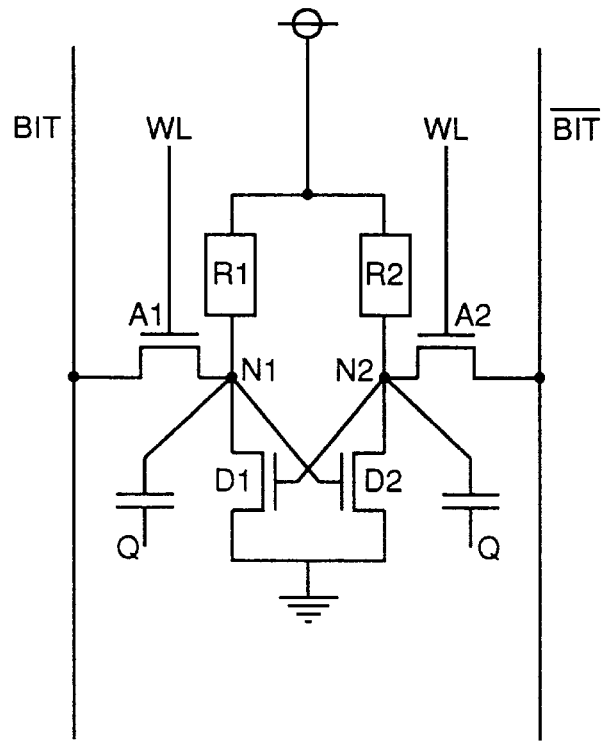
FIG. 59 is an equivalent circuit diagram showing a memory cell in a conventional SRAM.
Figure 60:
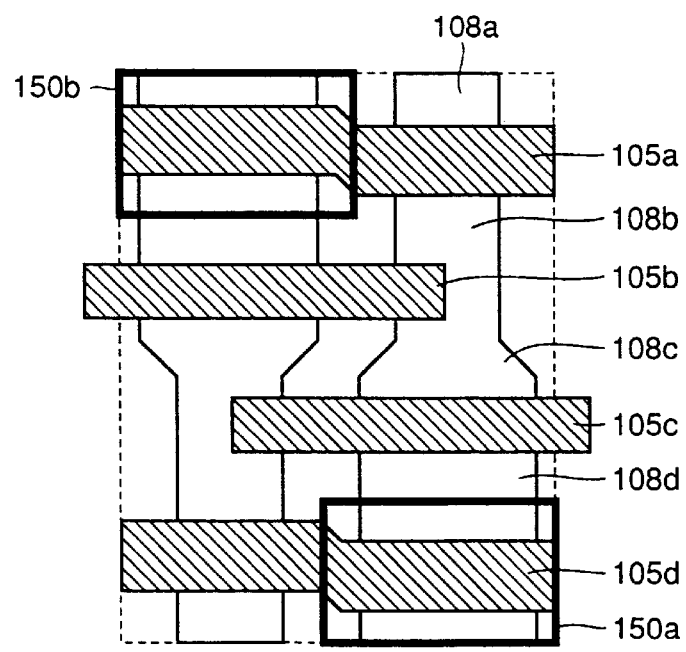
FIG. 60 shows a planar layout showing a polycrystalline silicon film and an active region at a first level of the memory cell in the conventional SRAM.

Referring to FIGS. 57 and 58, a memory cell structure of an embodiment 9 corresponds to modifications of the embodiments 5 to 8. More specifically, the embodiment 9 employs the storage node portion which has a two-layer structure formed of storage node connected interconnection 24c and storage node connected portion 11c similarly to the embodiment 5. Similarly to the embodiment 8, each of Vcc interconnections 11e and 11f has a single layer structure. Further, the embodiment 9 employs a bit line contact pad portion formed of two bit line contact pads, i.e., a first bit line contact pad 24e made of the same interconnection layer as storage node connected interconnection 24c, and second bit line contact pad 14a made of the same layer as GND interconnection 14b. An $SiO_2$ film 50 is formed at the surface of interlayer insulating film 9, and dielectric film 12 is formed on $SiO_2$ film 50.

In this embodiment 9, the upper side surface of the storage node portion is formed of side surfaces of the two layers, i.e., storage node connected interconnection 24c and storage node connected portion 11c, so that the storage node portion has an increased surface area, and therefore the storage node can have an increased capacity similarly to the foregoing embodiments. Since the first bit line contact pad portion 24e is made of the same layer as storage node connected interconnection 24c, and the second bit line contact pad 14a is made of the same layer as GND interconnection 14b. Therefore, the upper surface of the second bit line contact pad portion 14a can be substantially flush with the upper surface of GND interconnection 14b located at the storage node portion. Thereby, the flatness can be further improved.

Figure 53:
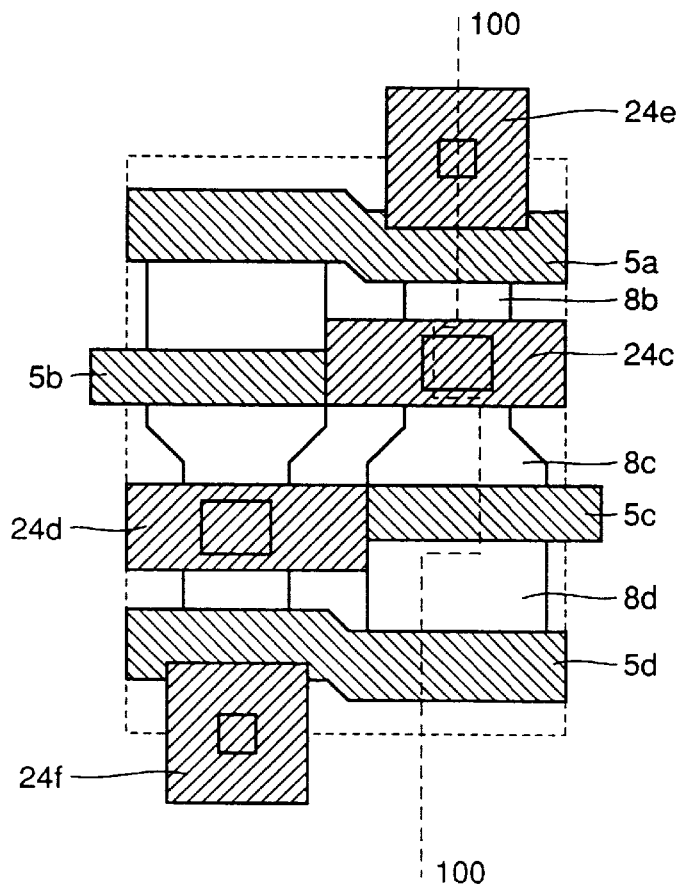
FIG. 53 shows a planar layout, and particularly shows a process of manufacturing a memory cell in an SRAM of an embodiment 9 of the invention.
Figure 54:
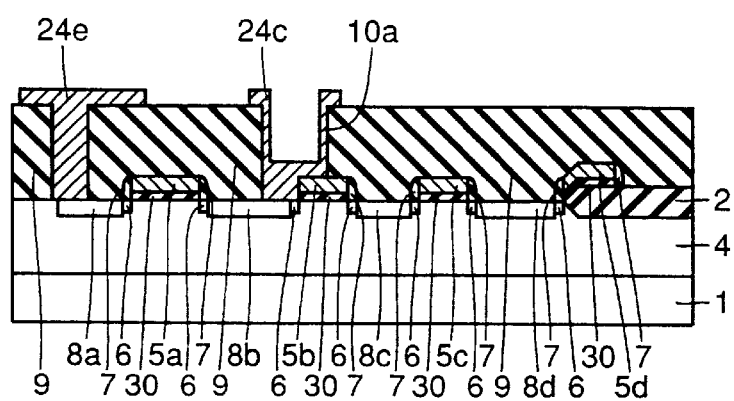
FIG. 54 is a cross section of the memory cell taken along line 100—100 in FIG. 53.

According to a manufacturing process of the embodiment 9, a process similar to that of the embodiment 5 shown in FIGS. 32 and 33 is performed for patterning the polycrystalline silicon film at the second level in such a manner that bit line contact pads 24e and 24f shown in FIGS. 53 and 54 are formed together with storage node connected interconnections 24c and 24d. In this process, Vcc interconnections 24a and 24b (see FIG. 33) are not formed in contrast to the embodiment 5.

Figure 55:
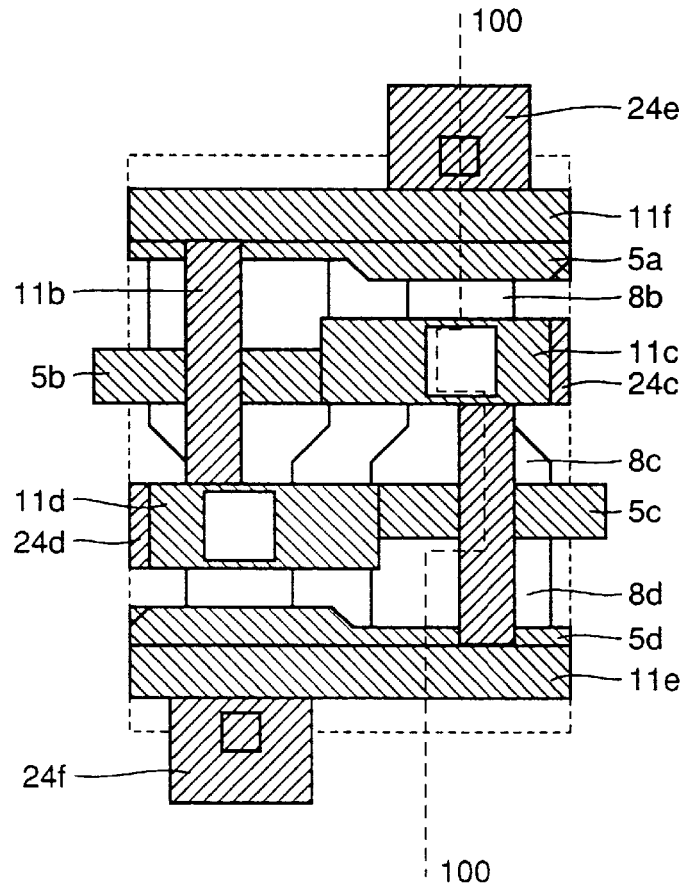
FIG. 55 shows a planar layout, and particularly shows a process of manufacturing the memory cell in the SRAM of the embodiment 9 of the invention.
Figure 56:
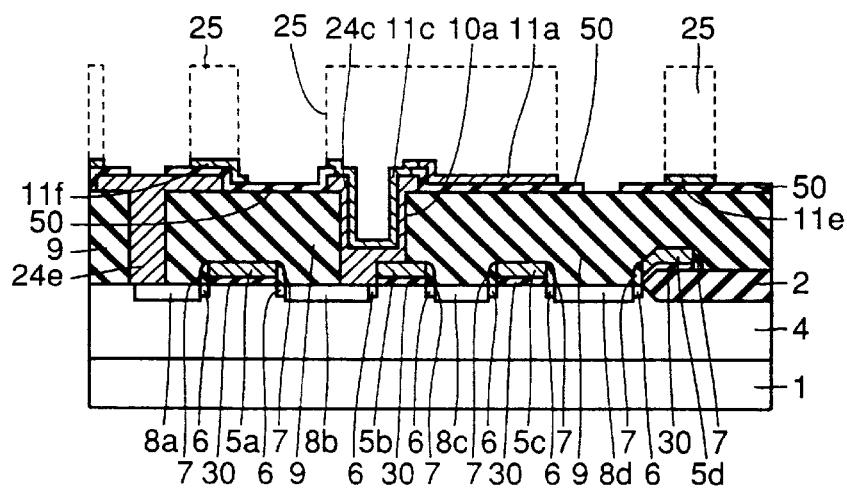
FIG. 56 is a cross section of the memory cell taken along line 100—100 in FIG. 55.

As shown in FIGS. 55 and 56, $SiO_2$ film 50 of about 100–500 Å in thickness is formed, and then only predetermined regions of $SiO_2$ film 50 located above storage node connected interconnections 24c and 24d are removed. Thereafter, a natural oxide film at the upper surface of storage node connected interconnection 24c is removed with hydrofluoric acid (HF) or the like. After depositing the polycrystalline silicon film of about 200–1000 Å in thickness at the third level by the LPCVD method, photoresist 25 is formed at a predetermined region on the polycrystalline silicon film at the third level. Using photoresist 25 as a mask, dry etching is effected on the polycrystalline silicon film at the third level by the RIE method, so that patterned polycrystalline silicon films 11 (11a–11f) are formed as shown in FIG. 56. Thereafter, photoresist 25 is removed. Through a process similar to that of the embodiment 5, the memory cell of the embodiment 9 is completed as shown in FIGS. 57 and 58.

Although the present invention has been described and illustrated in detail, it is clearly understood that the same is by way of illustration and example only and is not to be taken by way of limitation, the spirit and scope of the present invention being limited only by the terms of the appended claims. For example, the invention may employ a combination of the foregoing embodiments 1 to 9.

What is claimed is:

1. A semiconductor device comprising:

a plurality of memory cells, each of said memory cells comprising:

a first interconnection layer formed on a semiconductor substrate, and including a high-resistance interconnection portion and a storage node portion, said high-resistance interconnection portion comprised of separate first and second portions, said first interconnection layer further including a power supply interconnection portion comprised of separate first and second portions respectively connected to the first and second portions of said high resistance interconnection portion;

a GND interconnection layer formed on said first interconnection layer with a dielectric film therebetween, wherein said storage node portion of said first interconnection layer, said GND interconnection layer and said dielectric film form a capacitor element, and said first interconnection layer is arranged symmetrically around a center of said memory cell; and a second interconnection layer including a gate electrode, formed on said semiconductor substrate and located under said first interconnection layer; and wherein memory cells formed next to each other in a direction of a word line have the same planar layout, the first portion of the high resistance interconnection portion of one memory cell, the first portion of the high resistance interconnection of another memory cell adjacent the one memory cell, and the first portion of the power supply interconnection connected to these first portions of the high resistance interconnection portion form a closed end area surrounded at three sides thereof, said first interconnection layer includes a lower layer in contact with said semiconductor substrate and said second interconnection layer, and an upper layer formed on said lower layer, and said GND interconnection layer covers side surfaces of said lower and upper layers with said dielectric film therebetween, and the closed end area has an opening divided into two parts by the second portion of the high resistance interconnection portion of the one memory cell.

2. The semiconductor device according to claim 1, further comprising:

first and second impurity regions connected to said GND interconnection layer and forming a GND region, wherein said first impurity region and said second impurity region are formed independently of each other in each of said memory cells, and said first and second impurity regions in each of said memory cells are formed independently of said GND region in the neighboring memory cell.

3. The semiconductor device according to claim 1, further comprising:

first and second impurity regions connected to said GND interconnection layer and forming a GND region, wherein said first and second impurity regions do not overlap with said word line in a planar layout.

4. The semiconductor device according to claim 1, further comprising:

a second interconnection layer including a gate electrode, formed on said semiconductor substrate and located under said first interconnection layer.

5. The semiconductor device according to claim 4, further comprising:

a first interlayer insulating film formed on said second interconnection layer and said semiconductor substrate, located under said first interconnection layer, and having a first contact hole connecting said second interconnection layer and said semiconductor substrate to said first interconnection layer, wherein said first contact hole has a diameter larger than double the sum of the thickness of said first interconnection layer and the thickness of said dielectric film, and smaller than double the sum of the thickness of said first interconnection layer, the thickness of said dielectric film and the thickness of said GND interconnection layer.

6. The semiconductor device according to claim 5, wherein said first interlayer insulating film includes a second contact hole connecting said GND interconnection layer to said first and second impurity regions, and said second contact hole has a diameter smaller than double the thickness of said GND interconnection layer.

7. The semiconductor device according to claim 1, wherein a portion of said dielectric film forming the capacitor element of said storage node portion has a thickness smaller than that of the other portion.

8. The semiconductor device according to claim 1, wherein said dielectric film has an extended portion located at least on the upper, side and lower surfaces of said storage node portion of said first interconnection layer.

9. The semiconductor device according to claim 1, wherein said GND interconnection layer has a two-layer structure.

10. The semiconductor device according to claim 1, wherein said lower layer includes a power supply interconnection portion.

11. The semiconductor device according to claim 1, wherein said upper layer includes a power supply interconnection portion.

12. The semiconductor device according to claim 1, wherein said upper layer includes said high-resistance portion, and said lower layer is thicker than said upper layer.

13. The semiconductor device according to claim 1, further comprising:

a bit line leader electrode formed of the same layer as said lower layer.

14. The semiconductor device according to claim 1, further comprising:

a first interlayer insulating film formed on said second interconnection layer and said semiconductor substrate, located under said first interconnection layer, and having a first contact hole connecting said second interconnection layer and said semiconductor substrate to said first interconnection layer, wherein said first contact hole has a diameter larger than double the sum of the thickness of said lower layer, the thickness of said upper layer and the thickness of said dielectric film, and smaller than double the sum of the thickness of said lower layer, the thickness of said upper layer, the thickness of said GND interconnection layer and the thickness of said dielectric film layer.

15. The semiconductor device according to claim 1, wherein the plurality of memory cells are formed of three layers of polycrystalline silicon.

16. The semiconductor device of claim 1, wherein only a single conductive layer for conductive interconnections is formed in the first interconnection layer between the high-resistance interconnection portion and the semiconductor substrate.

* * * * *

UNITED STATES PATENT AND TRADEMARK OFFICE
CERTIFICATE OF CORRECTION

PATENT NO. : 6,271,569 B1
DATED : August 7, 2001
INVENTOR(S) : Yoshiyuki Ishigaki et al.

It is certified that error appears in the above-identified patent and that said Letters Patent is hereby corrected as shown below:

<u>Title page,</u>
Item [30], Foreign Application Priority Data,
change "9-1784019" to -- 9-178401 --

Signed and Sealed this

Nineteenth Day of March, 2002

Attest:

JAMES E. ROGAN
*Attesting Officer*  *Director of the United States Patent and Trademark Office*